(12) United States Patent
Koide

(10) Patent No.: US 7,977,183 B2
(45) Date of Patent: Jul. 12, 2011

(54) SEMICONDUCTOR DEVICE AND METHOD OF MANUFACTURING SAME

(75) Inventor: Yuki Koide, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/605,328

(22) Filed: Oct. 24, 2009

(65) Prior Publication Data

US 2010/0117158 A1    May 13, 2010

(30) Foreign Application Priority Data

Nov. 11, 2008  (JP) .................................. 2008-289160
Mar. 30, 2009  (JP) .................................. 2009-082880

(51) Int. Cl.
*H01L 21/8234* (2006.01)

(52) U.S. Cl. ........ 438/238; 438/197; 438/597; 438/666; 438/675

(58) Field of Classification Search .................. 438/238, 438/197, 597, 666, 675
See application file for complete search history.

(56) References Cited

U.S. PATENT DOCUMENTS 7,115,954 B2 * 10/2006 Shimizu et al.
7,488,690 B2 *  2/2009 Iyer et al.

FOREIGN PATENT DOCUMENTS

JP   2008-506262 T  *  2/2008
WO   WO-02/43151 A1 *  5/2002

* cited by examiner

*Primary Examiner* — Long Pham
(74) *Attorney, Agent, or Firm* — Miles & Stockbridge P.C.

(57) ABSTRACT

To provide a technique capable of improving the reliability of a semiconductor device even if the downsizing thereof is advanced.

The technical idea of the present invention lies in the configuration in which in a first to a third silicon nitride film to be formed by lamination, the respective film thicknesses thereof are not constant but become smaller in order from the third silicon nitride film in the upper layer to the first silicon nitride film in the lower layer while the total film thickness thereof is kept constant. Due to this it is possible to improve the embedding characteristic of the third silicon nitride film in the uppermost layer in particular, while ensuring the tensile stress of the first to third silicon nitride films, which makes effective the strained silicon technique.

21 Claims, 30 Drawing Sheets

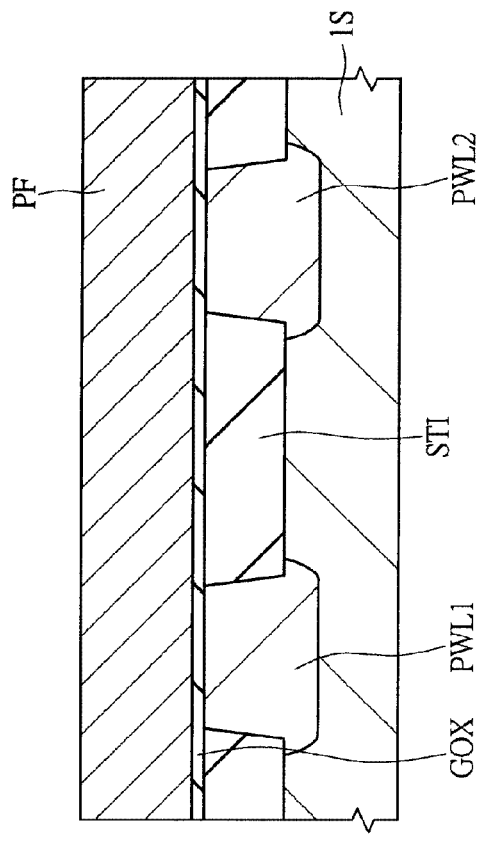
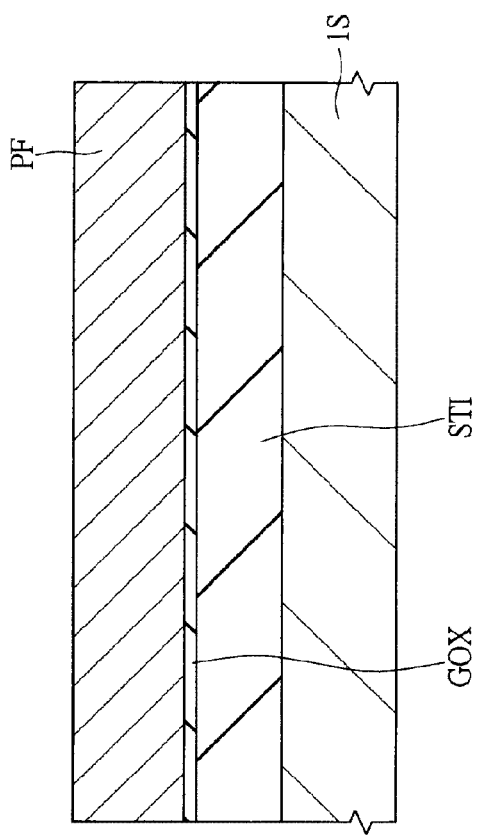
FIG. 16

SEMICONDUCTOR DEVICE AND METHOD OF MANUFACTURING SAME

CROSS-REFERENCE TO RELATED APPLICATION

The disclosure of Japanese Patent Application No. 2008-289160 filed on Nov. 11, 2008 and Japanese Patent Application No. 2009-82880 filed on Mar. 30, 2009 including the specification, drawings and abstract is incorporated herein by reference in its entirety.

BACKGROUND OF THE INVENTION

The present invention relates to a semiconductor device and its manufacturing technique, in particular, to technology which is effective when applied to a miniaturized semiconductor device and its manufacturing.

Published Japanese translation of PCT patent application No. 2008-506262 (Patent Document 1) describes a semiconductor device comprising a multilayer nitride stack having nitride etch stop layers formed by lamination, wherein each of the nitride etch stop layers is formed using a film formation process. A method of forming a multilayer nitride stack includes the steps of arranging a substrate in a single wafer deposition chamber and applying a thermal shock to the substrate immediately before deposition. A first nitride etch stop layer is deposited over the substrate. A second nitride etch stop layer is deposited over the first nitride etch stop layer. At this time, it is assumed that the first nitride etch stop layer and the second nitride etch stop layer have the same film thickness.

International Patent Publication No. WO2002/043151 Pamphlet (Patent Document 2) describes the method of generating tensile stress in an n-channel MISFET to generate compression stress in a p-channel MISFET using a self-alignment silicon nitride film. It further describes the method of forming a silicon nitride film that causes the n-channel MISFET to generate tensile stress and laminating a silicon nitride film that causes the p-channel MISFET to generate tensile stress and a silicon nitride film that causes the p-channel MISFET to generate compression stress. Then, an example etc. is disclosed, which while causing the n-channel MISFET to generate tensile stress, relaxes tensile stress generated in the p-channel MISFET.

SUMMARY OF THE INVENTION

In recent years, downsizing of a semiconductor device including a plurality of MISFETs (Metal Insulator Semiconductor Field Effect Transistors) is advanced. In order to promote the downsizing of a semiconductor device, a gate electrode that constitutes each MISFET is miniaturized and at the same time, the MISFETs are arranged highly densely. That is, the region between gate electrodes of neighboring MISFETs is narrowed.

In a semiconductor device, after a plurality of MISFETs is formed over a semiconductor substrate, a silicon nitride film is formed so as to cover the MISFETs and a silicon oxide film is formed over the silicon nitride film. At this time, if the region between gate electrodes of neighboring MISFETs is narrowed, the embedding characteristic of a silicon nitride film to be formed so as to be embedded in the region are deteriorated. Because of this, when a silicon oxide film is formed over the region between gate electrodes of the neighboring MISFETs via the silicon nitride film, the deterioration of the embedding characteristic of the silicon nitride film formed in the lower layer of the silicon oxide film is reflected, and therefore, a void is produced in the silicon oxide film to be formed over the region.

Thereafter, a plurality of contact holes that penetrate through the silicon oxide film and the silicon nitride film is formed in the region between the gate electrodes and a plug is formed by embedding a barrier conductor film and a conductive film in the contact hole. At this time, if there is a void in the silicon oxide film, the contact holes formed in the region between the gate electrodes are coupled to each other via the void and then, the barrier conductor film and the conductive film to be embedded in the contact hole flow into the inside of the void. This causes neighboring plugs formed by embedding the barrier conductor film and the conductive film in the contact hole to short-circuit electrically via the conductive materials (barrier conductor film and conductive film) that have flowed into the void. If different voltages are applied to the short-circuited plugs, the circuit of the semiconductor device malfunctions and the yields of the product are deteriorated. Further, if the semiconductor device in which a short circuit defect has occurred in the neighboring plugs is not detected in a probe inspection, the reliability of the semiconductor is degraded and defective products appear on the market, as a result.

An object of the present invention is to provide a technique capable of improving the reliability of a semiconductor device even if the downsizing of the semiconductor device is advanced.

The other purposes and the novel feature of the present invention will become clear from the description of the present specification and the accompanying drawings.

The following describes briefly the outline of a typical invention among the inventions disclosed in the present application.

A method of manufacturing a semiconductor device according to a typical embodiment comprises the steps of: (a) forming a plurality of MISFETs including a first MISFET and a second MISFET neighboring each other over a semiconductor substrate; and (b) after the step (a), forming a multilayer insulating film over the semiconductor substrate including a first region between a first gate electrode of the first MISFET and a second gate electrode of the second MISFET. The method further comprises the steps of: (c) after the step (b), forming an interlayer insulating film over the multilayer insulating film; and (d) after the step (c), forming a plurality of contact holes that penetrate through the interlayer insulating film and the multilayer insulating film and reach the semiconductor substrate in the first region along a first direction in which the first and second gate electrodes extend in parallel. The method still further comprises the step of (e) after the step (d), forming a plug by embedding a conductive material in the contact holes. Here, the step (b) includes the steps of: (b1) forming a first insulating film having a first film thickness to be formed over the respective gate electrodes of the MISFETs over the semiconductor substrate; and (b2) after the step (b1), forming a second insulating film having a second film thickness greater than the first film thickness to be formed over the respective gate electrodes of the MISFETs over the first insulating film. Then, the multilayer insulating film includes the first insulating film and the second insulating film, the first and second insulating films are formed of the same material, and the interlayer insulating film and the first and second insulating films are formed of a different material.

A semiconductor device according to a typical embodiment comprises a first MISFET and a second MISFET having a gate insulating film, a gate electrode, a sidewall, a source region, and a drain region, and further having a channel formation region in which a channel is formed during its operation over a semiconductor substrate under the gate electrode via the gate insulating film. Then, the semiconductor device further include a multilayer insulating film formed so as to cover the first MISFET and the second MISFET over the semiconductor substrate including a first region between the gate electrode of the first MISFET and the gate electrode of the second MISFET. Furthermore, the semiconductor device includes an interlayer insulating film formed over the multilayer insulating film and having the film thickness greater than that of the multilayer insulating film. Furthermore, the semiconductor device includes a plurality of plugs formed in the interlayer insulating film and in the multilayer insulating film and being coupled to the source region and the drain region of the first MISFET and the second MISFET. Then, the multilayer insulating film includes a first insulating film and a second insulating film having a film thickness greater than that of the first insulating film. Further, the first and second insulating films are formed of the same material, and the interlayer insulating film and the first and second insulating films are formed of a different material.

The following describes briefly the effect acquired by the typical invention among the inventions disclosed in the present application.

It is possible to improve reliability of a semiconductor device even if the downsizing of the semiconductor device is advanced.

BRIEF DESCRIPTION OF THE DRAWINGS

FIG. 16 is a section view showing the manufacturing process of a semiconductor device, following FIG. 15.

DETAILED DESCRIPTION OF THE PREFERRED EMBODIMENTS

Figure 1:
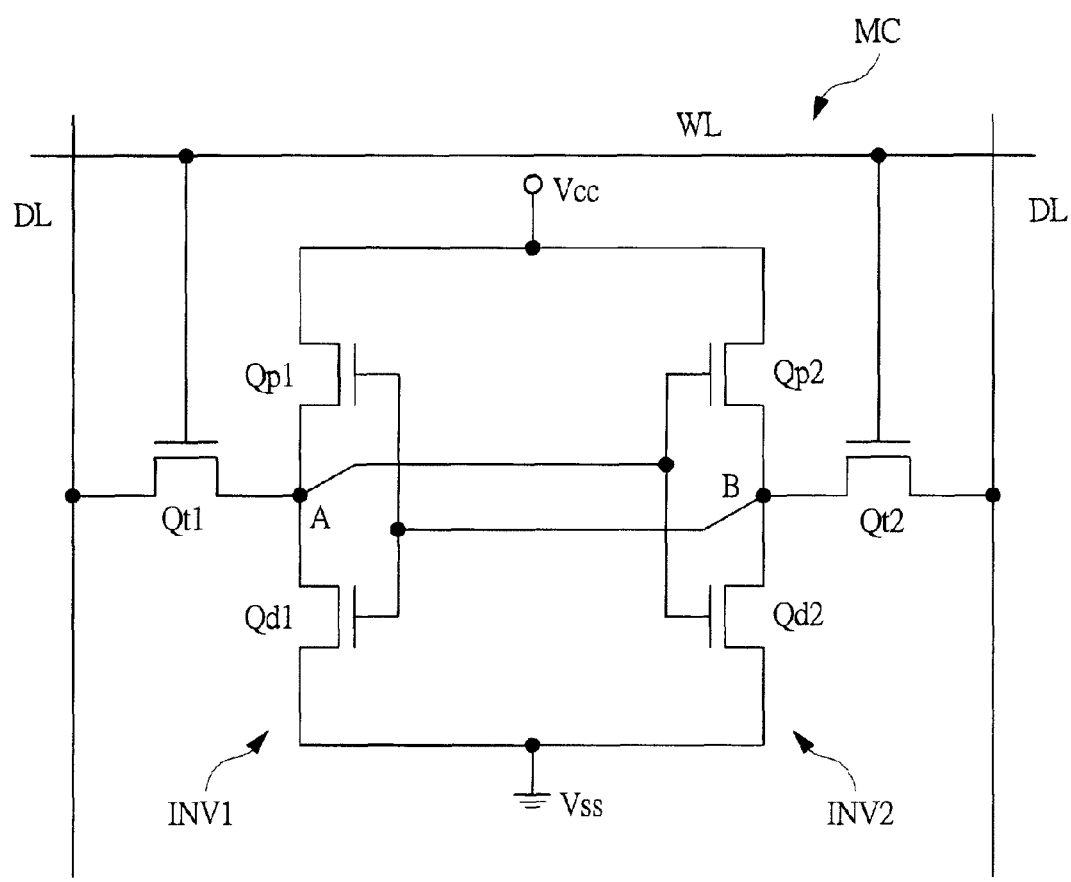
FIG. 1 is a diagram showing an equivalent circuit of a memory cell constituting an SRAM.

The following embodiments will be described, divided into plural sections or embodiments, if necessary for convenience. Except for the case where it shows clearly in particular, they are not mutually unrelated and one has relationships such as a modification, details, and supplementary description of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc.

Similarly, in the following embodiments, when shape, positional relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

In all the drawings for illustrating embodiments, the same symbol is attached to the same member, as a principle, and the repeated description thereof will be omitted. In order to make a drawing intelligible, hatching may be attached even if it is a plan view.

First Embodiment

From the standpoint of the reduction in the cost of a semiconductor device, an attempt is made to increase the number of semiconductor chips that can be obtained from one semiconductor wafer. If the number of semiconductor chips that can be obtained from one semiconductor wafer is increased, the cost per semiconductor chip can be reduced, and therefore, the reduction in the cost of a semiconductor device can be realized. Because of this, in order to increase the number of semiconductor chips that can be obtained from one semiconductor wafer, an attempt is made to reduce in size individual semiconductor chips.

For example, an integrated circuit including a plurality of MISFETs (field effect transistors) is formed in a semiconductor chip, and in order to downsize the semiconductor chip, attempts are made to reduce the gate length (width in the channel direction) of a gate electrode of each MISFET and to reduce the region between the gate electrodes of neighboring MISFETs. Specifically, in a logic circuit including a logical circuit, the gate length has been reduced in size and the region between gate electrodes has been reduced in size. Similarly, the semiconductor chip has been reduced in size not only in a logic circuit but also in an integrated circuit including an SRAM (Static Random Access Memory).

In an SRAM, however, the gate length of a gate electrode has not been reduced so positively, but the region between gate electrodes has been reduced to promote downsizing. The reason for that the gate length of a gate electrode is not reduced when an attempt is made to realize downsizing of an SRAM as described above is as follows. If the gate length of a gate electrode is reduced in size in order to downsize a semiconductor device, the variations in processed dimensions of a gate electrode tend to increase. Because of this, if the gate length is reduced in size more than necessary in an SRAM, the variations in the gate length increase in the MISFETs constituting the SRAM. If the variations in the gate length increase, the operation margin of the SRAM is reduced, and as a result, the memory operation stability of the SRAM is degraded. That is, in an SRAM, the influence of the process variations in the gate length on the memory operation is large and from the standpoint of ensuring the stability of the memory operation, it is not possible to reduce in size the gate length of a gate electrode so much in an SRAM. That is, the process variations in the gate length increase as the gate electrode is miniaturized and the operation margin for the process variations in the gate length becomes severer in a MISFET that constitutes an SRAM than in a MISFET that constitutes a logic circuit. Because of this, in a MISFET that constitutes a logic circuit, the gate length is reduced in size and the region between gate electrodes is also reduced in order to downsize the integrated circuit. In contrast to this, in a MISFET that constitutes an SRAM, the gate length is not reduced in size but only the region between gate electrodes is reduced in order to downsize the SRAM.

Consequently, the reduction in size of the region between gate electrodes is promoted more positively in an SRAM than in a logic circuit for which an attempt is also made to downsize the integrated circuit by the reduction in the gate length. For example, the realization of the same downsizing is considered for both a logic circuit and an SRAM. In this case, in a logic circuit, both the reduction in the gate length and the reduction in size of the region between gate electrodes are made, and therefore, because of the reduction in the gate length, the reduction in size of the region between gate electrodes is demanded less severely. On the other hand, in an SRAM, the reduction in size of the region between gate electrodes is made mainly, and therefore, in order to realize the same downsizing of both a logic circuit and an SRAM, it is required to narrow the region between gate electrodes more in the SRAM. From the above, it can be seen that the trend toward narrower regions between gate electrodes appears more noticeably in the SRAM in particular.

In a semiconductor device, after a plurality of MISFETs is formed over a semiconductor substrate, a silicon nitride film is formed so as to cover the MISFETs and a silicon oxide film is formed over the silicon nitride film. At this time, if the region between gate electrodes of neighboring MISFETs is narrowed, there arises a problem that the embedding characteristic of a silicon nitride film formed so as to be embedded in the region is deteriorated. The deterioration of the embedding characteristic of the silicon nitride film appears more noticeably when the region between gate electrodes is narrowed accompanying the downsizing of a semiconductor chip. Because of this, if the region between gate electrodes is narrowed in order to realize the downsizing also in a logic circuit and an SRAM, the embedding characteristic of a silicon nitride film to be embedded in this region is deteriorated. In particular, in an SRAM, the reduction in size of the region between gate electrodes seems to advance more than in a logic circuit, and therefore, it can be thought that the deterioration in the embedding characteristic of a silicon nitride film to be embedded in the region between gate electrodes will appear more noticeably than in a logic circuit.

In such circumstances described above, in a first embodiment, an SRAM will be described as an example of a semiconductor device. However, the technical idea of the first embodiment can also be applied widely to a logic circuit, a DRAM, or a nonvolatile memory including a flash memory, etc., not limited to an SRAM.

First, an equivalent circuit of a memory cell MC constituting an SRAM will be described. FIG. 1 is an equivalent circuit diagram showing the memory cell MC of an SRAM in a first embodiment. As shown in FIG. 1, the memory cell MC is disposed at an intersection of a pair of complementary data lines (data line DL, data line/(bar) DL) and a word line WL and includes a pair of drive MISFETs Qd1, Qd2, a pair of load MISFETs Qp1, Qp2, and a pair of transfer MISFETs Qt1, Qt2. The drive MISFETs Qd1, Qd2 and the transfer MISFETs Qt1, Qt2 include an n-channel MISFET and the load MISFETs Qp1, Qp2 include a p-channel MISFET.

Among the above-described six MISFETs that constitute the memory cell MC, the drive MISFET Qd1 and the load MISFET Qp1 constitute a CMOS inverter INV1, and the drive MISFET Qd2 and the load MISFET Qp2 constitute a CMOS inverter INV2. Mutual input/output terminals (storage nodes A, B) of a pair of the CMOS inverters INV1, INV2 are cross-coupled, constituting a flip-flop circuit as an information storage part for storing one-bit information. One of the input/output terminals (storage node A) of the flip-flop circuit is coupled to one of the source region and the drain region of the transfer MISFET Qt1 and the other of the input/output terminals (storage node B) is coupled to one of the source region and the drain region of the transfer MISFET Qt2.

Further, the other of the source region and the drain region of the transfer MISFET Qt1 is coupled to the data line DL and the other of the source region and the drain region of the transfer MISFET Qt2 is coupled to the data line /DL. One end of the flip-flop circuit (each source region of the load MISFETs Qp1, Qp2) is coupled to a wire through which a power supply voltage (Vcc) is supplied and the other end (each source region of the drive MISFETs Qd1, Qd2) is coupled to a wire through which a reference voltage (Vss) is supplied.

The operation of the above-described circuit will be described. When the storage node A of one CMOS inverter INV1 is at a high potential ("H"), the drive MISFET Qd2 becomes ON, and therefore, the storage node B of the other CMOS inverter INV2 becomes a low potential ("L"). Because of this, the drive MISFET Qd1 becomes OFF and the high potential ("H") of the storage node A is retained. That is, a latch circuit in which a pair of the CMOS inverters INV1, INV2 are cross-coupled retains the state of the mutual storage nodes A, B and information is preserved while the power supply voltage is applied.

To the respective gate electrodes of the transfer MISFETs Qt1, Qt2, the word line WL is coupled, which controls the conduction state and the non-conduction state of the transfer MISFETs Qt1, Qt2. That is, when the word line WL is at the high potential ("H"), the transfer MISFETs Qt1, Qt2 become ON and the latch circuit and the complementary data lines (data lines DL, /DL) are coupled electrically, and therefore, the potential state of the storage nodes A, B ("H" or "L") appears on the data lines DL, /DL and is read as information of the memory cell MC.

When information is written to the memory cell MC, the word line WL is set to the "H" potential level and the transfer MISFETs Qt1, Qt2 are brought into the ON state, and thus, the information of the data lines DL, /DL is transmitted to the storage nodes A, B. In this manner, it is possible to operate an SRAM.

Figure 2:
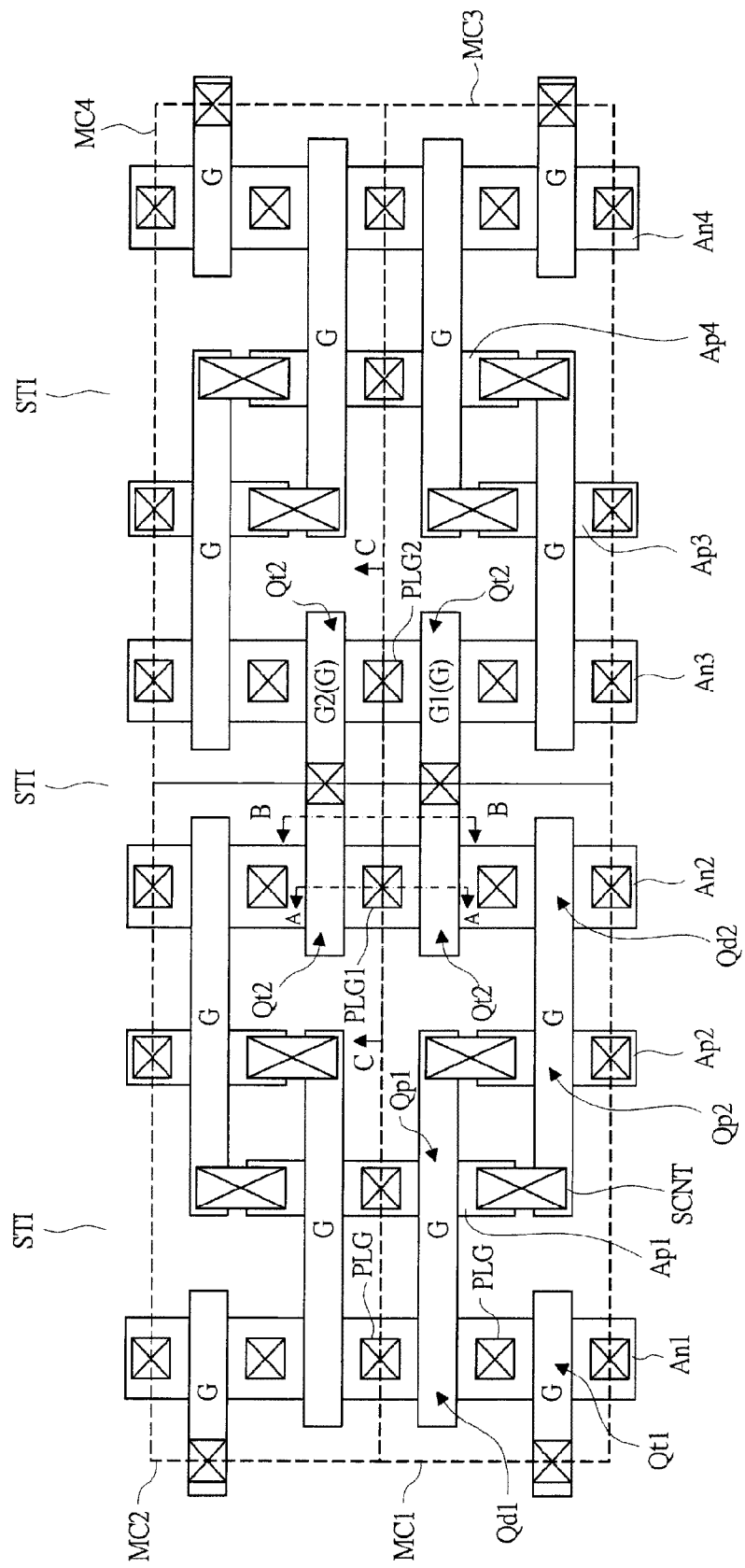
FIG. 2 is a diagram showing a layout configuration of an SRAM.

Next, an example of a layout configuration of the above-described SRAM will be described with reference to FIG. 2. FIG. 2 is a schematic plan view showing a layout configuration of an SRAM. For example, in FIG. 2, four memory cells MC1 to MC4 (corresponding to four bits) that constitute an SRAM are shown. The layout configuration of the memory cell will be described using one memory cell MC1 of these memory cells.

The memory cell MC1 in the SRAM includes, for example, as shown in FIG. 2, six field effect transistors, that is, a pair of the drive MISFETs Qd1, Qd2, a pair of the load MISFETs Qp1, Qp2, and a pair of the transfer MISFETs Qt1, Qt2 formed over a semiconductor substrate. The pair of the drive MISFETs Qd1, Qd2 and the pair of the transfer MISFETs Qt1, Qt2 include an n-channel MISFET and the pair of the load MISFETs Qp1, Qp2 includes a p-channel MISFET.

Specifically, the semiconductor substrate is divided into a plurality of active regions An1, An2, An3, An4, Ap1, Ap2, Ap3, and Ap4 by element isolation regions STI. The structure is such that the active regions An1, An2, An3, An4, Ap1, Ap2, Ap3, and Ap4 divided by the element isolation regions STI are arranged so as to extend side by side in a first direction of the semiconductor substrate (the longitudinal direction in FIG. 2) and the periphery of the active regions An1, An2, An3, An4, Ap1, Ap2, Ap3, and Ap4 is surrounded by the isolation regions STI. In the active regions An1, An2, An3, and An4 that form an n-channel MISFET, a source region and a drain region are formed by introducing n-type impurities, such as phosphorus and arsenic, into the active regions An1, An2, An3, and An4. Then, over the active regions An1, An2, An3, and An4 between the source region and the drain region, a gate electrode G is formed via a gate insulating film. The gate electrode G extends in a second direction (transverse direction) that intersects the first direction in which the active regions An1, An2, An3, and An4 extend. In this manner, an n-channel MISFET is formed by the gate electrode G formed over the active regions An1, An2, An3, and An4 and the source region and the drain region formed in the active regions An1, An2, An3, and An4 so as to sandwich the gate electrode G. Similarly, a p-channel MISFET is formed by the gate electrode G formed over the active regions Ap1, Ap2, Ap3, and Ap4 and the source region and the drain region formed in the active regions Ap1, Ap2, Ap3, and Ap4 so as to sandwich the gate electrode G.

For example, in the memory cell MC1 of the SRAM, the drive MISFET Qd1 and the transfer MISFET Qt1 are formed in the same active region An1 by the source region and the drain region formed in the active region An1 and the two gate electrodes G. The load MISFET Qp1 is formed by the source region and the drain region formed in the active region Ap1 and the gate electrode G, and the load MISFET Qp2 is formed by the source region and the drain region formed in the active region Ap2 and the gate electrode G. Similarly, the drive MISFET Qd2 and the transfer MISFET Qt2 are formed in the same active region An2 by the source region and the drain region formed in the active region An2 and the gate electrode G.

In the memory cell MC1 of the SRAM, for example, in the drive MISFET Qd1 and the transfer MISFET Qt1 formed in the active region An1, a plug PLG is electrically coupled to the source region and the drain region. Further, the active region Ap2 in which the load MISFET Qp1 is formed and the gate electrode G that constitutes the load MISFET Qp2 are electrically coupled via a shared contact plug SCNT.

Subsequently, a configuration of the MISFET that constitutes the SRAM will be described using the two transfer MISFETs Qt2 cut along A-A line in FIG. 2 as an example. The two transfer MISFETs Qt2 are the transfer MISFET Qt2 of the memory cell MC1 and the transfer MISFET Qt2 of the memory cell MC2. Because the transfer MISFET Qt2 includes an n-channel MISFET, it is assumed that the transfer MISFET Qt2 is an n-channel MISFET in FIG. 3.

Figure 3:
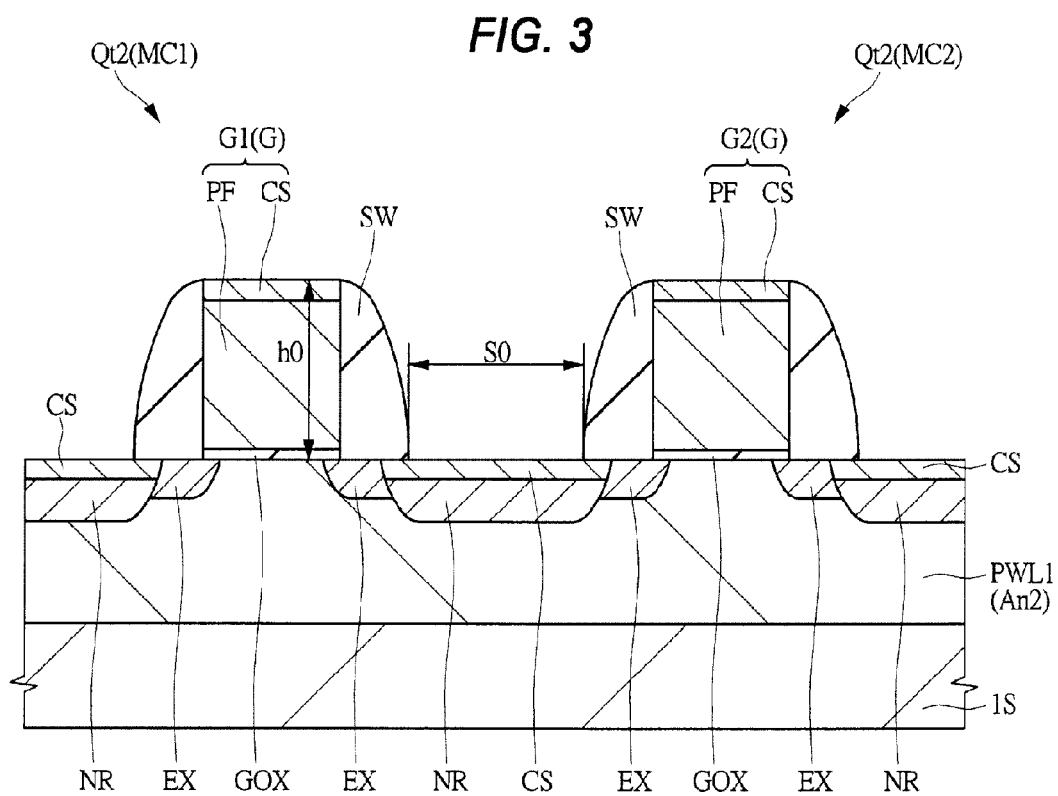
FIG. 3 is a diagram showing a section view cut along A-A line in FIG. 2.

FIG. 3 is a diagram showing a sectional structure of two n-channel MISFETs that constitute an SRAM, a section view cut along the A-A line in FIG. 2. Using FIG. 3, the structure of the n-channel MISFET in the first embodiment will be described. The structures of the two n-channel MISFETs shown in FIG. 3 are substantially the same, and therefore, one of the n-channel MISFETs (for example, MISFET on the left-hand side in FIG. 3) is taken as an example and its structure will be described.

As shown in FIG. 3, over a semiconductor substrate 1S, a p-type well PWL1 (active region An2) is formed and over the semiconductor substrate 1S over which the p-type well PWL1 is formed, a gate insulating film GOX is formed. Then, over the gate insulating film GOX, a gate electrode G1 (a gate electrode G2 in the MISFET on the right-hand side in FIG. 3) is formed. In the first embodiment, the gate insulating film GOX is formed of, for example, a silicon oxide film. On the other hand, the gate electrode G1 includes, for example, a laminated film of a polysilicon film PF and a nickel silicide film CS as a conductive film. Into the polysilicon film PF, for example, n-type impurities, such as phosphorus, are introduced and a threshold voltage of the n-channel MISFET is adjusted. The nickel silicide film CS formed over the polysilicon film PF is formed to reduce the resistance of the gate electrode G1. Then, on the side wall on both sides of the gate electrode G1, a sidewall SW is formed. The sidewall SW is formed from, for example, an insulating film, such as a silicon oxide film, a silicon nitride film, or a silicon oxynitride film. The sidewall SW may be formed from a laminated film in which these insulating films are laminated. Further, the nickel silicide film CS is illustrated as a silicide film in the first embodiment, however, the silicide film may be formed as another silicide film by a platinum silicide film, a cobalt silicide film, or a titanium silicide film. The gate electrode G1 illustrates a case where a silicide film is formed over a polycrystalline silicon film, however, a full metal gate structure using a metal film may also be applied.

Next, in the p-type well PWL1 immediately under the sidewall SW, a shallow n-type impurity diffusion region EX provided in alignment with the gate electrode G1 is formed. The shallow n-type impurity diffusion region EX is a semiconductor region formed by introducing n-type impurities, such as phosphorus (P) and arsenic (As), into the semiconductor substrate 1S. In the p-type well PWL1 outside the shallow n-type impurity diffusion region EX, a deep n-type impurity diffusion region NR is formed in alignment with the sidewall SW. The deep n-type impurity diffusion region NR is also formed by introducing n-type impurities, such as phosphorus and arsenic, into the semiconductor substrate 1S, forming a semiconductor region. The source region and the drain region of the n-channel MISFET are formed in this manner by a pair of the shallow n-type impurity diffusion regions EX and a pair of the deep n-type impurity diffusion regions NR. On the surface of the deep n-type impurity diffusion region NR, the nickel silicide film CS is formed in order to reduce the resistance thereof. The n-channel MISFET is formed over the semiconductor substrate 1S as described above.

In the SRAM, as shown in FIG. 2, in addition to the n-channel MISFETs (the transfer MISFETs Qt1, Qt2, the drive MISFETs Qd1, Qd2), the p-channel MISFETs (the load MISFETs Qp1, Qp2) are also formed. The configuration of the p-channel MISFET constituting the SRAM is substantially the same as that of the n-channel MISFET shown in FIG. 3. A difference lies in that the conduction type of the semiconductor region is an inverse conduction type. Specifically, the n-channel MISFET shown in FIG. 3 is formed over the p-type well PWL1, however, the p-channel MISFET is formed over an n-type well. Then, in the n-channel MISFET, the source region and the drain region include the shallow n-type impurity diffusion region EX and the deep n-type impurity diffusion region NR, however, in the p-channel MISFET, the source region and the drain region include a shallow p-type impurity diffusion region and a deep p-type impurity diffusion region.

As described above, the memory cell MC1 of the SRAM shown in FIG. 2 includes, for example, four n-channel MISFETs and two p-channel MISFETs as a result.

As shown in FIG. 3, the two n-channel MISFETs constituting the SRAM are formed so as to neighbor each other, and accompanying the miniaturization of the SRAM, for example, the distance (region) between the gate electrode G1 and the gate electrode G2 of the two n-channel MISFETs shown in FIG. 3 is narrowed. At this time, a silicon nitride film is formed so as to cover the n-channel MISFET, however, the embedding characteristic when the silicon nitride film is embedded in the region between the gate electrodes not only relates to the distance between the gate electrodes but also depends on the height of the gate electrodes G1, G2. That is, even if the distance between the gate electrodes is reduced, the embedding characteristic of the silicon nitride film is not deteriorated so much if the height of the gate electrodes G1, G2 is low. In other words, even if the distance between the gate electrodes is great, the embedding characteristic of the silicon nitride film is deteriorated more as the height of the gate electrodes G1, G2 becomes greater. Because of this, as an index to determine the embedding characteristic of a silicon nitride film, a so-called aspect ratio is used.

The region between gate electrodes shown in the present embodiment means the region between the sidewalls SW formed on the side walls of the gate electrodes.

The aspect ratio will be described below with reference to FIG. 3. In FIG. 3, it is first assumed that the distance between the gate electrode G1 and the gate electrode G2 is S0. To be precise, the distance S0 is the distance between the sidewall SW formed on the side wall of the gate electrode G1 and the sidewall SW formed on the side wall of the gate electrode G2, however, the distance S0 is referred to as a distance between gate electrodes for convenience' sake in this specification. Next, the height of the gate electrode G1 and the gate electrode G2 is assumed to be h0. The height h0 is defined as the distance between the main surface of the semiconductor substrate 1S and the top surface of the gate electrodes G1, G2.

In this case, the aspect ratio is defined as (h0/S0) For example, if the height h0 of the gate electrode is kept constant and the distance S0, that is, the distance between gate electrodes, is reduced, the aspect ratio will increase. In this case, as the distance S0 is reduced, the embedding characteristic of the silicon nitride film is deteriorated. That is, it can be seen that as the aspect ratio is increased, the embedding characteristic of the silicon nitride film is deteriorated.

The downsizing of an SRAM is made by reducing the distance between the gate electrode G1 and the gate electrode G2 while maintaining the gate length of the gate electrodes G1, G2. That the gate length of the gate electrodes G1, G2 is maintained means that the height of the gate electrodes G1, G2 is also maintained from the standpoint of the scaling law of a MISFET. This can also be construed to mean that the height h0 of the gate electrodes G1, G2 is kept constant. On the other hand, because the downsizing of an SRAM is made by reducing the distance between the gate electrode G1 and the gate electrode G2, the distance S0 that indicates the distance between gate electrodes is reduced when the SRAM is downsized. Consequently, the aspect ratio defined by (h0/S0) is increased as the SRAM is downsized. An increase in the aspect ratio means that the embedding characteristic of the silicon nitride film is deteriorated. Because of this, it is known that the deterioration of the embedding characteristic of the silicon nitride film due to the downsizing of the SRAM can be determined by the aspect ratio.

In the first embodiment, the distance S0 between the gate electrodes G1, G2 is shown as the distance S0 between the sidewalls SW formed on the side walls of the gate electrodes G1, G2. In the first embodiment, the height h0 of the gate electrodes G1, G2 is about 70 to 100 nm, the distance between the gate electrodes G1, G2 is about 100 to 140 nm, and the width of the sidewall SW is about 20 to 40 nm. In this case, the distance S0 is about 20 to 100 nm.

Here, in the SRAM, as shown in FIG. 2, the gate electrode G1 and the gate electrode G2 are arranged so as to be parallel with each other. Because of this, it can be thought that the distance between the gate electrode G1 and the gate electrode G2 is constant and the aspect ratio between the gate electrode G1 and the gate electrode G2 is constant. In reality, however, even if the distance (S0) between the gate electrode G1 and the gate electrode G2 is constant, the aspect ratio varies depending on whether the region that exists under the gate electrode G1 and the gate electrode G2 is an active region or an element isolation region. The aspect ratio is higher in a position where the region that exists under the gate electrode G1 and the gate electrode G2 is an element isolation region than in a position where the region that exists under the gate electrode G1 and the gate electrode G2 is an active region. That is, the position where the region that exists under the gate electrode G1 and the gate electrode G2 is an element isolation region is a position where the aspect ratio is particularly high in the SRAM and the embedding characteristic of the silicon nitride film is most likely deteriorated in this position.

The reason for the above will be described. As shown in FIG. 2, the gate electrode G1 and the gate electrode G2 arranged so as to be parallel with each other extend across the active region An2, the element isolation region STI, and the active region An3. In this case, a section view along the A-A line in FIG. 2 is shown in FIG. 3. It can be said that FIG. 3 illustrates an example in which the region that exists under the gate electrode G1 and the gate electrode G2 is the active region An2. In this case, the aspect ratio is (h0/S0).

Figure 4:
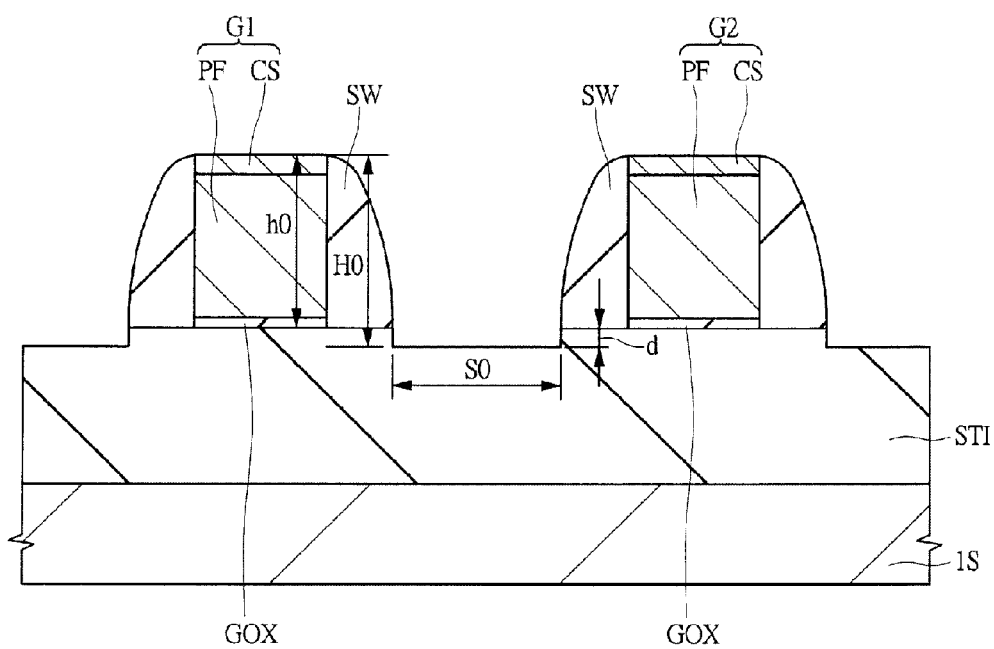
FIG. 4 is a diagram showing a section view cut along B-B line in FIG. 2.

On the other hand, FIG. 4 shows a section view cut along the B-B line in FIG. 2. That is, FIG. 4 shows an example in which the region that exists under the gate electrode G1 and the gate electrode G2 is the element isolation region STI. In FIG. 4, the aspect ratio between the gate electrode G1 and the gate electrode G2 is considered. As shown in FIG. 4, the element isolation region STI is formed over the main surface of the semiconductor substrate 1S, however, it can be seen that the surface of the element isolation region STI is cut out and a groove with a depth d is formed. That is, on the side wall of the gate electrode G1 and on the side wall of the gate electrode G2, the sidewalls SW are formed, respectively, however, the element isolation region STI that is exposed between the sidewalls SW is cut out and the groove with the depth d is formed. The reason for the formation of the groove with the depth d will be described.

The sidewalls SW are formed by forming a silicon oxide film so as to cover the gate electrodes G1, G2 and performing anisotropic etching of the silicon oxide film. By the anisotropic etching, the surface of the exposed element isolation region STI is etched. That is, the film formed so as to cover the gate electrodes G1, G2 is a silicon oxide film and the silicon oxide film is embedded also in the element isolation region STI, and therefore, by the anisotropic etching of the silicon oxide film that forms the sidewall SW, part of the element isolation region STI is also etched. As a result, the surface of the exposed element isolation region STI is etched and the groove with the depth d is formed in the element isolation region STI.

In contrast to this, as shown in FIG. 3, when the region that exists under the gate electrode G1 and the gate electrode G2 is the active region An2, the active region An2 is a region that contains silicon as its principal component and different from the silicon oxide film to be formed over the active region An2. Because of this, even if the anisotropic etching of the silicon oxide film formed so as to cover the gate electrodes G1, G2 is performed and the sidewall SW is formed on the side walls of the gate electrodes G1, G2, the exposed active region An2 is not etched. As a result, the active region An2 is not cut out and therefore no groove is formed.

Further, in the manufacturing process of a semiconductor device, various cleaning processes are performed, and in the cleaning process, the silicon oxide film is more easily removed than the region that contains silicon as its principal component. Because of this, the element isolation region STI exposed from the sidewall SW is more easily cut out than the active region An2 exposed from the sidewall SW.

From the above, as shown in FIG. 4, when the region that exists under the gate electrode G1 and the gate electrode G2 is the element isolation region STI, the aspect ratio between the gate electrode G1 and the gate electrode G2 is (H0/S0). At this time, the height H0 is the sum of the height h0 of the gate electrodes G1, G2 from the main surface of the semiconductor substrate 1S and the depth d of the groove formed on the surface of the element isolation region STI (H0=h0+d). Consequently, if the distance S0, that is, the distance between the gate electrode G1 and the gate electrode G2 is assumed to be the same in FIG. 3 and in FIG. 4, the aspect ratio (H0/S0) in the case shown in FIG. 4 is higher than the aspect ratio (h0/S0) in the case shown in FIG. 3. As described above, it can be seen that the aspect ratio is higher in the position (FIG. 4) where the region that exists under the gate electrode G1 and the gate electrode G2 is the element isolation region STI than in the position (FIG. 3) where the region that exists under the gate electrode G1 and the gate electrode G2 is the active region An2. That is, the position where the region that exists under the gate electrode G1 and the gate electrode G2 is the element isolation region STI is a position where the aspect ratio is particularly high in the SRAM, and it is known that the deterioration of the embedding characteristic of the silicon nitride film is most likely to occur in this position.

In the first embodiment, the configuration is such that the silicon nitride film is formed first as an insulating film over the semiconductor substrate 1S including the region between the gate electrode G1 and the gate electrode G2, and then, for example, the silicon oxide film is formed as an interlayer insulating film. As described above, after the silicon nitride film is formed first over the semiconductor substrate 1S including the region between the gate electrode G1 and the gate electrode G2, the silicon oxide film is formed. Because of this, the embedding characteristic of the silicon nitride film to be embedded in the region between the gate electrode G1 and the gate electrode G2 becomes important.

Instead of the formation of the silicon oxide film that will become an interlayer insulating film directly on the semiconductor substrate including the region between the gate electrode G1 and the gate electrode G2, the formation of the silicon oxide film after the silicon nitride film is formed will be described below with reference to the drawings (FIG. 5 to FIG. 9). FIG. 5 to FIG. 9 are diagrams corresponding to the section view cut along the A-A line in FIG. 2.

Figure 5:
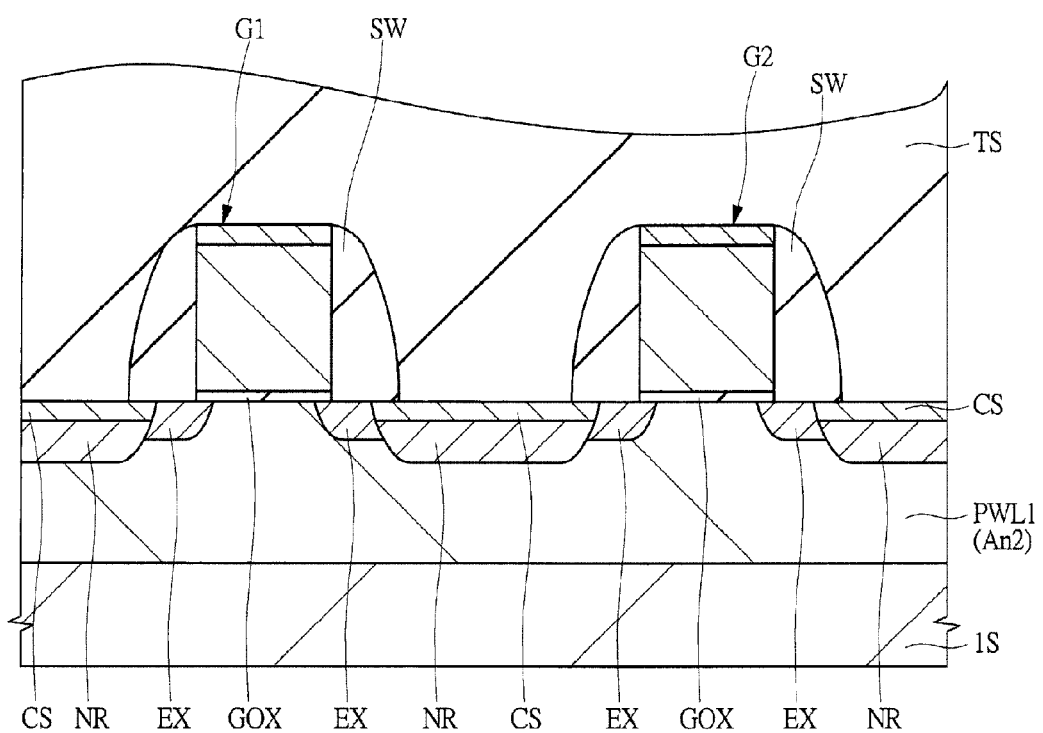
FIG. 5 is a section view when a silicon oxide film is formed over a MISFET.
Figure 6:
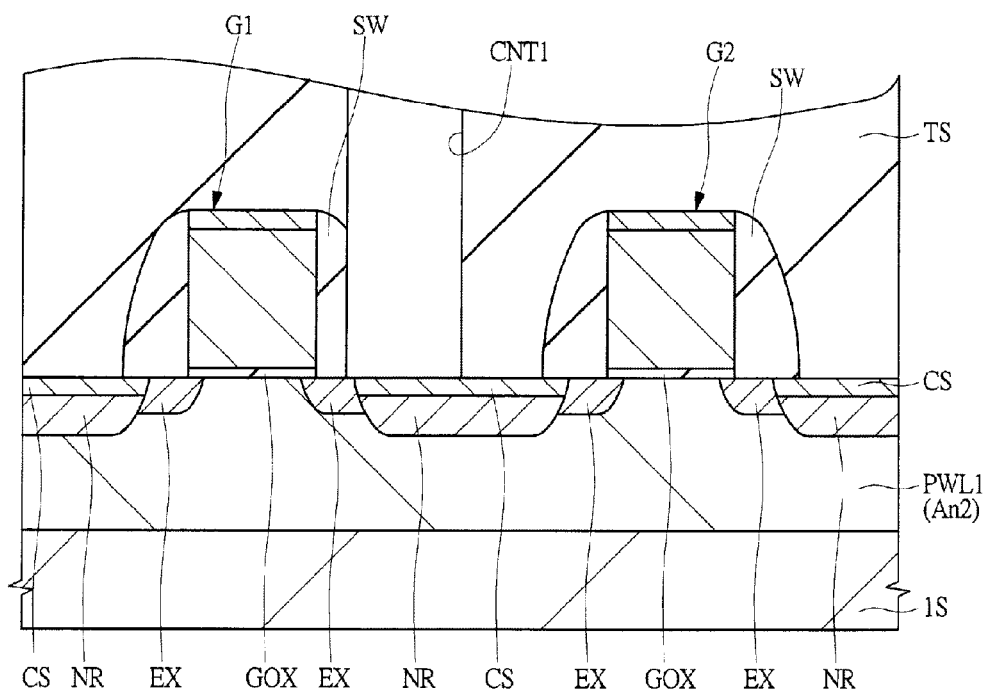
FIG. 6 is a section view showing an example in which a contact hole is formed in a shifted state, following FIG. 5.

First, a problem will be described, which arises when the silicon oxide film is formed directly on the semiconductor substrate 1S including the region between the gate electrode G1 and the gate electrode G2. As shown in FIG. 5, a silicon oxide film TS is formed over the semiconductor substrate 1S including the region between the gate electrode G1 and the gate electrode G2. Then, as shown in FIG. 6, using the photolithography technique and etching technique, a contact hole CNT1 is formed, which penetrates through the silicon oxide film TS and reaches the source region (in particular, the deep n-type impurity diffusion region NR) and the drain region (in particular, the deep n-type impurity diffusion region NR) formed over the semiconductor substrate 1S. At this time, the contact hole CNT1 is normally formed in the middle between the gate electrode G1 and the gate electrode G2, however, it is assumed that the position of the contact hole CNT1 is shifted toward the side of the gate electrode G1 due to, for example, the shift in position (misalignment) in the photolithography technique (refer to FIG. 6). Then, the contact hole CNT1 comes into contact with the sidewall SW as a result, however, the sidewall SW is also formed from the same silicon oxide film as the silicon oxide film TS, and therefore, it will be etched. Because of this, the contact hole CNT1 and the gate electrode G1 are formed so as to be close to each other, and therefore, the possibility becomes high that a short circuit defect may occur between a plug to be embedded in the contact hole CNT1 and the gate electrode G1. Further, because the position of the contact hole CNT1 is shifted toward the gate electrode G1 side, part of the bottom of the contact hole CNT1 comes into contact with the shallow n-type impurity diffusion region EX in which the nickel silicide film CS is not formed. Because of this, the contact resistance between the plug formed by embedding a conductive material in the contact hole CNT1 and the source region or the drain region is increased.

Figure 7:
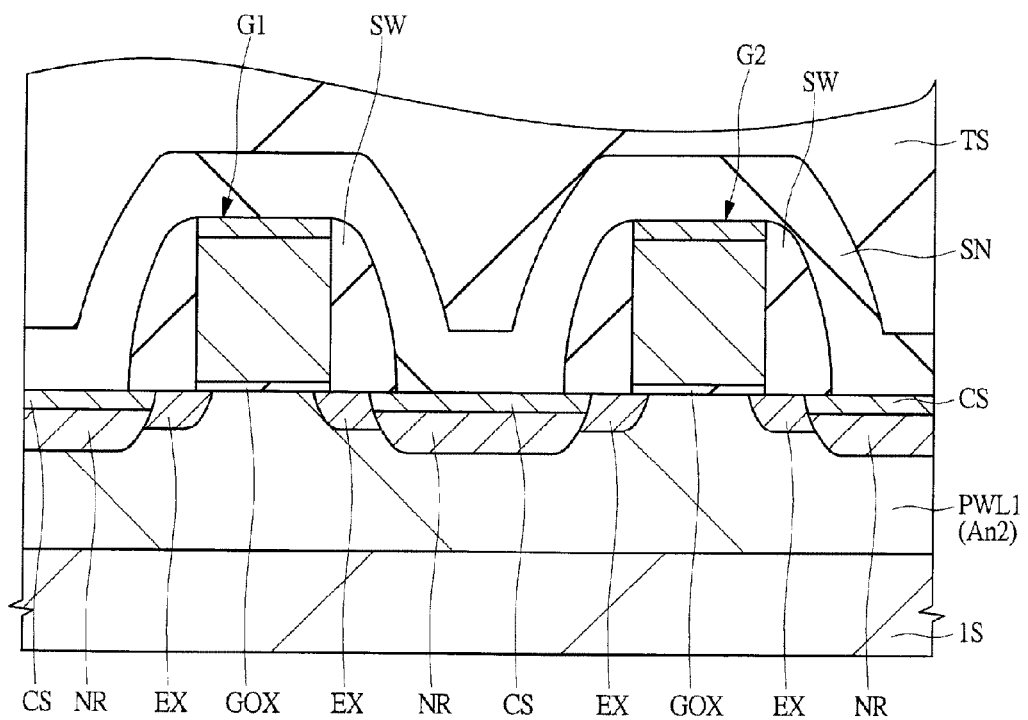
FIG. 7 is a section view when a silicon oxide film is formed after a silicon nitride film is formed over a MISFET.

Because of this, instead of forming the silicon oxide film directly on the semiconductor substrate 1S including the region between the gate electrode G1 and the gate electrode G2, the silicon nitride film is formed first and then, the silicon oxide film is formed over the silicon nitride film. Specifically, as shown in FIG. 7, after the formation of a silicon nitride film SN over the semiconductor substrate 1S including the region between the gate electrode G1 and the gate electrode G2, the silicon oxide film TS is formed over the silicon nitride film SN.

Figure 8:
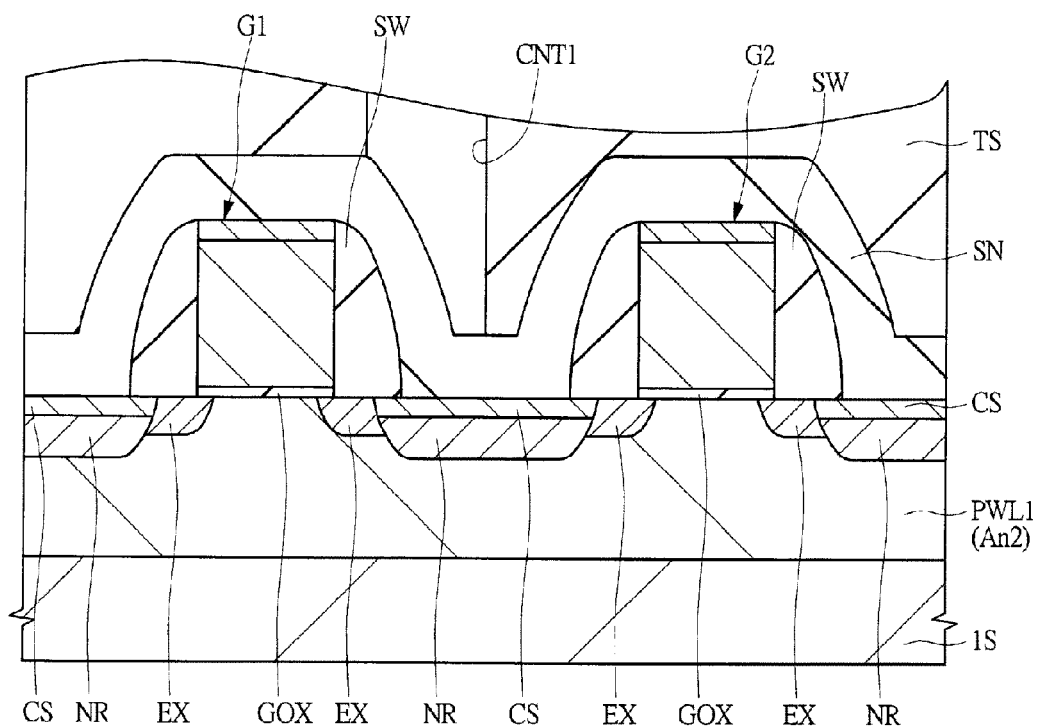
FIG. 8 is a section view showing an example in which a contact hole is formed in a shifted state, following FIG. 7.

Next, using the photolithography technique and etching technique, the contact hole CNT1 is formed by etching the silicon oxide film TS, as shown in FIG. 8. At this time, it is assumed that the position of the contact hole CNT1 is shifted toward the gate electrode G1 side due to, for example, the shift in position (misalignment)) in the photolithography technique. However, because the silicon nitride film SN for which the etching selection ratio with the silicon oxide film TS is maintained is formed, it is unlikely that the contact hole CNT1 is etched so as to penetrate through the silicon nitride film SN. Consequently, even if the contact hole CNT1 is formed so as to be shifted toward the gate electrode G1 side, the silicon nitride film SN functions as an etching stopper film, and therefore, it is unlikely that the sidewall SW formed in the lower layer of the silicon nitride film SN is etched.

Figure 9:
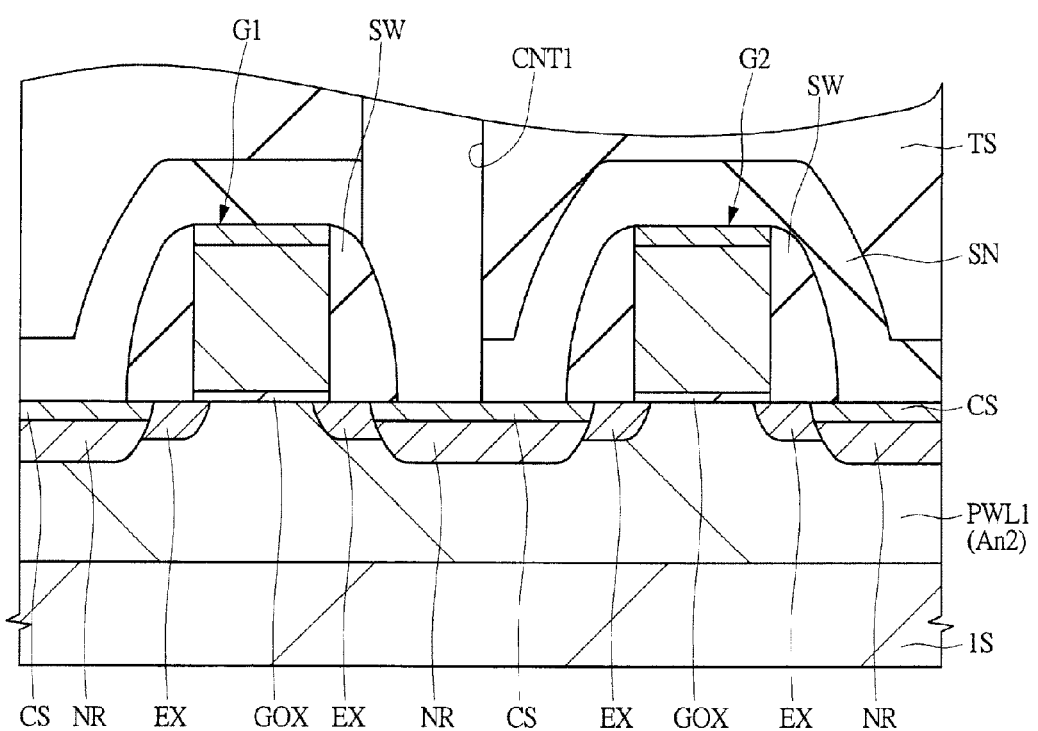
FIG. 9 is a section view for illustrating advantages of the SAC technique, following FIG. 8.

Thereafter, as shown in FIG. 9, the silicon nitride film SN exposed to the bottom of the contact hole CNT1 is etched. Here, because the silicon nitride film SN is etched, the sidewall SW formed from the silicon oxide film is not etched, and the contact hole CNT1 is formed along the sidewall SW in a self-alignment manner. As a result, even if the contact hole CNT1 shifts toward the gate electrode G1 side, the bottom of the contact hole CNT1 comes into contact with the nickel silicide film CS formed over the deep n-type impurity diffusion region NR in a self-alignment manner.

Because of this, the sidewall SW is not etched even if the contact hole CNT1 is formed so as to be shifted toward the gate electrode G1 side, and therefore, it is possible to ensure the distance between the plug formed by embedding a conductive material in the contact hole CNT1 and the gate electrode G1. As a result of this, it is possible to suppress a short circuit defect between the plug and the gate electrode G1. Further, the bottom of the contact hole CNT1 is formed so as to come into contact with the top part of the nickel silicide film CS in a self-alignment manner, and therefore, it is possible to suppress an increase in the contact resistance between the plug and the source region or the drain region.

As described above, it is possible to obtain the effect that the short circuit defect caused by the shift in position of the contact hole CNT1 and the increase in the contact resistance can be suppressed by forming the silicon oxide film over the silicon nitride film after forming the silicon nitride film first over the semiconductor substrate 1S including the region between the gate electrode G1 and the gate electrode G2. That is, the silicon nitride film, which is an insulating film, functions as an etching stopper film. This technique is called SAC (Self Align Contact). That is, the silicon nitride film SN formed over the semiconductor substrate 1S including the region between the gate electrode G1 and the gate electrode G2 has the function to realize the SAC technique and the function to suppress the occurrence of a defect caused by the shift in position of the contact hole CNT1.

Further, the silicon nitride film SN, which is an insulating film, has another function. This function will be described. In recent years, there is a strained silicon technique as a technique aiming at the improvement in performance of a MISFET. The strained silicon technique is a technique that improves the mobility of carries (electrons and holes) that flow through a channel by giving stress resulting from the strain in the channel formation region of a MISFET. According to the strained silicon technique, it is possible to realize the improvement in performance of a MISFET by improving the mobility of carriers that flow through a channel.

Specifically, in an n-channel MISFET, tensile stress of 1.3 GPa to 1.7 GPa is applied to the channel region in a semiconductor substrate to improve the mobility of electrons. On the other hand, in a p-channel MISFET, compression stress, opposite to the tensile stress, is applied to the channel region in the semiconductor substrate to improve the mobility of holes. At this time, the compression stress generated in a p-channel MISFET is about 1.3 GPa to 1.7 GPa. The values of the tensile stress and the compression stress shown in the first embodiment are stresses in the opposite directions and expressed by their absolute values. That is, when the compression stress generated in a p-channel MISFET is expressed by 1.3 GPa to 1.7 GPa, the tensile stress generated in an n-channel MISFET can be expressed by −1.3 GPa to −1.7 GPa. In the following description, when the value of stress is expressed, it is expressed basically by an absolute value.

As described above, in the strained silicon technique, stress is generated in a semiconductor substrate and the silicon nitride film SN described above has the function to generate stress. That is, stress resulting from a difference between the interstice of the silicon nitride film SN and the interstice of silicon that constitutes a semiconductor substrate is generated, and thereby, stress is generated in the channel of the semiconductor substrate. Specifically, it is required for the silicon nitride film SN that generates stress to have a film thickness of a predetermined film thickness or more in order to generate internal stress.

An advantage of realizing a film that generates such stress using a SAC silicon nitride film as described in the first embodiment will be described. As the background of the above-described strained silicon technique, the main trend at first was to generate biaxial stress in a channel region. The biaxial stress is stress that is generated in the gate length direction and in the gate width direction. It has been turned out from an experiment that when the biaxial stress is used, the drive current does not increase so much as expected. In particular, an increase in electric current was small in a p-channel MISFET. This was because the stress generated in the gate length direction increased electric current, however, the stress generated in the gate width direction reduced electric current. Because of this, uniaxial stress to generate stress only in the gate length direction was required. Although the stress generated by the film itself is biaxial stress, the SAC silicon nitride film such as that described in the first embodiment is formed in the position along the side wall of the gate electrode, and therefore, strong stress is generated in the direction from the side wall on one side of the gate electrode toward the other side wall. That is, for example, as can be seen by reference to each gate electrode G in FIG. 2, it is general to extend the gate electrode so that the length in the gate width direction is greater in order to ensure an amount of electric current. It is also general to scale the gate electrode so that the length in the gate length direction is less for high-speed operation. Because of this, when the gate electrode is covered with the SAC silicon nitride film, it is possible to make by far greater the stress generated in the gate length direction than the stress generated in the gate width direction. That is, it is possible to generate stress mainly in the gate length direction.

In order to increase electric current in a MISFET using such stress, it is required for stress to be generated in the entire channel region located between the source region and the drain region and located under the gate electrode. That is, in an n-channel MISFET, uniaxial tensile stress (stress to increase the distance between Si atoms) is applied to the entire channel region in the gate length direction and in a p-channel MISFET, the uniaxial compression stress (stress to reduce the distance between Si atoms) to the entire channel region in the gate length direction. Because of this, the values of the stresses in the n-channel MISFET and the p-channel MISFET are set to 1.3 GPa to 1.7 GPa. When these values are small, for example, about 100 MPa, the stresses affect only the part in the vicinity of the end part of the gate electrode, and therefore, does not increase electric current. Further, it is necessary to generate stress in the entire channel region, and therefore, the effect is small for a MISFET in which the gate length of the gate electrode is great. In the first embodiment, a case is supposed where the gate length of the gate electrode is 130 nm or less, preferably, 90 nm or less, and most preferably, 65 nm or less.

In the first embodiment, for the embedding characteristic of the silicon nitride film SN, a case is supposed where the distance between gate electrodes is reduced while the gate length is maintained, however, in the case also, where the gate length is reduced and the distance between gate electrodes is reduced, the same effect can be obtained. That is, the first embodiment can be applied also in the case where the gate length is 130 nm or less, or 90 nm or less, or 65 nm or less as described above.

It can be seen that the silicon nitride film SN, which is an insulating film, to be formed over the semiconductor substrate 1S including the region between the gate electrode G1 and the gate electrode G2 has a first function to realize the SAC technique and a second function to realize the strained silicon technique as described above. Because, over the semiconductor substrate 1S including the region between the gate electrode G1 and the gate electrode G2, the silicon nitride film SN that realizes the above-described functions is formed first, if the region between the gate electrode G1 and the gate electrode G2 is narrowed, a problem arises that the embedding characteristic of the silicon nitride film SN to be embedded in the region is deteriorated.

When the downsizing of an SRAM is advanced, the region (distance) between the gate electrode G1 and the gate electrode G2 is narrowed and the aspect ratio increases. If the aspect ratio increases, the embedding characteristic of the silicon nitride film SN to be embedded in the region (distance) between the gate electrode G1 and the gate electrode G2 is deteriorated. As a method to suppress the deterioration of the embedding characteristic of the silicon nitride film SN, it is conceived to reduce the film thickness of the silicon nitride film SN. However, as described above, the silicon nitride film SN has the function to realize the strained silicon technique by generating stress and it is required for the silicon nitride film SN that generates stress to have a film thickness of a predetermined thickness or more in order to generate internal stress. Because of this, if the downsizing of an SRAM is realized, the region (distance) between the gate electrode G1 and the gate electrode G2 is narrowed and the aspect ratio increases, and on the other hand, it is necessary to ensure a certain film thickness of the silicon nitride film SN, and therefore, the embedding characteristic of the silicon nitride film SN is deteriorated in particular. Specifically, when the region (distance) between the gate electrode G1 and the gate electrode G2 is narrowed and the aspect ratio is 1.4 or more and the film thickness of the silicon nitride film SN becomes ½ or more of the region (distance) between the gate electrode G1 and the gate electrode G2, the deterioration of the embedding characteristic of the silicon nitride film SN becomes more noticeable.

Next, problems caused by the deterioration of the embedding characteristic of the silicon nitride film SN will be described using comparative examples the inventors of the present invention have discussed and then, the technical idea to solve the problems in the first embodiment will be described.

FIG. 10 to FIG. 14 are section views showing a manufacturing process of a semiconductor device in comparative examples the inventors of the present invention have discussed. On the left-hand side in FIG. 10 to FIG. 14, the section view along the B-B line in FIG. 2 is shown and on the right-hand side in FIG. 10 to FIG. 14, the section view along a C-C line in FIG. 2 is shown.

Figure 10:
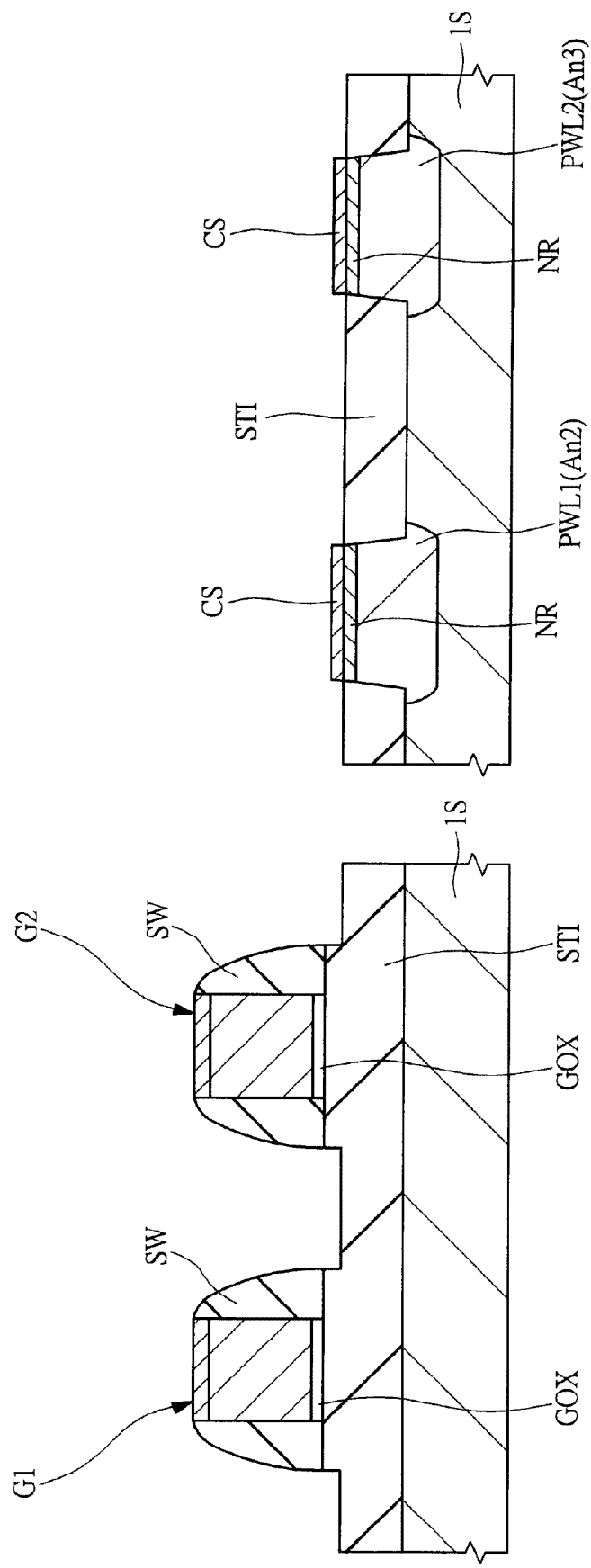
FIG. 10 is a section view showing a manufacturing process of a semiconductor device in a comparative example the inventors of the present invention have discussed.

First, FIG. 10 shows a state where a MISFET is formed over the semiconductor substrate 1S. In the diagram on the left-hand side in FIG. 10, the gate electrode G1 and the gate electrode G2 are formed a fixed distance apart from each other over the element isolation region STI formed in the semiconductor substrate 1S, and on the side wall of the gate electrode G1 and on the side wall of the gate electrode G2, the sidewalls SW are formed. On the other hand, in the diagram on the right-hand side in FIG. 10, in the active regions An2, An3, respectively, defined by the element isolation region STI, the p-type wells PWL1, PWL2 are formed and over the p-type wells PWL1, PWL2, the deep n-type impurity diffusion region NR is formed. Then, on the surface of the deep n-type impurity diffusion region, the nickel silicide film CS is formed.

Figure 11:
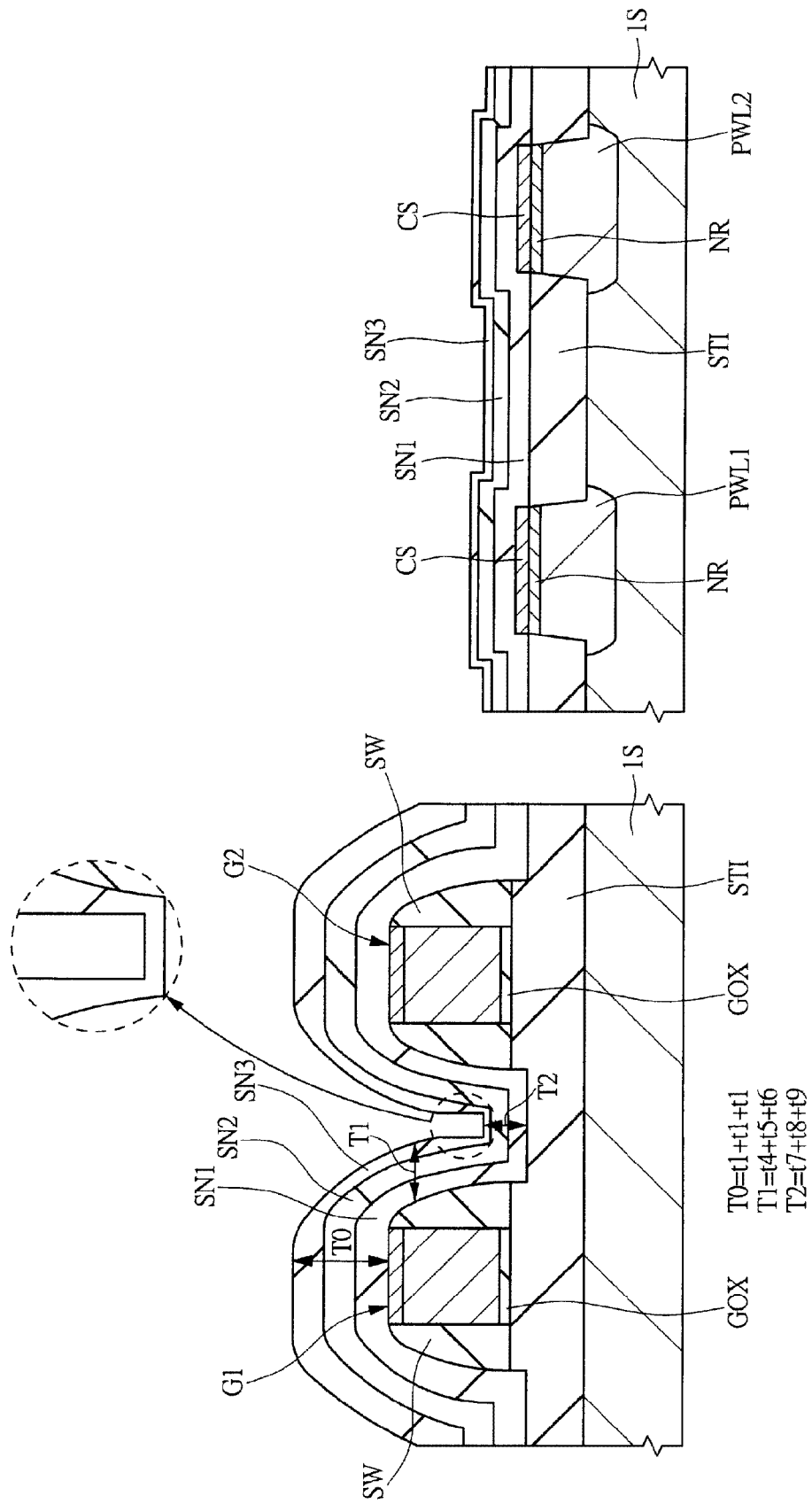
FIG. 11 is a section view showing the manufacturing process of a semiconductor device, following FIG. 10.

Subsequently, as shown in FIG. 11, silicon nitride films SN1 to SN3 are formed sequentially over the semiconductor substrate 1S so as to cover the gate electrode G1 and the gate electrode G2. Specifically, after the silicon nitride film SN1 is formed over the semiconductor substrate 1S using the plasma CVD method, the silicon nitride film SN1 is irradiated with ultraviolet rays. The irradiation of ultraviolet rays plays a role to bake and densify the silicon nitride film SN1 in order to generate tensile stress in the film of the silicon nitride film SN1. Then, the silicon nitride film SN2 is formed over the silicon nitride film SN1 using the plasma CVD method and the silicon nitride film SN2 is irradiated with ultraviolet rays. Further, after the silicon nitride film SN3 is formed over the silicon nitride film SN2 using the plasma CVD method, the silicon nitride film SN3 is irradiated with ultraviolet rays. In this manner, the silicon nitride films SN1 to SN3 can be formed.

The silicon nitride films SN1 to SN3 are formed separately in three layers as described above in order to effectively generate stress in the films of the respective silicon nitride films SN1 to SN3 by irradiating the respective silicon nitride films SN1 to SN3 with ultraviolet rays after forming them. The technique to separately and sequentially form the silicon nitride films SN1 to SN3 is described in, for example, Japanese Patent Application No. 2007-154280.

In this technique, however, the silicon nitride films SN1 to SN3 are formed under the same formation conditions and the film thickness thereof is the same. Specifically, if the film thickness of the silicon nitride films SN1 to SN3 over the gate electrode G1 is assumed to be the same thickness t1, the total film thickness T0 of the laminated silicon nitride films SN1 to SN3 can be expressed by T0=t1+t1+t1.

Ideally, it is desirable to form the laminated silicon nitride films SN1 to SN3 conformally, however, in reality, they are not formed conformally. That is, the film thickness of the silicon nitride films SN1 to SN3 is greatest over the gate electrodes G1, G2 and the film thickness of the silicon nitride films SN1 to SN3 to be formed on the two side walls of the gate electrodes G1, G2 and the film thickness of the silicon nitride films SN1 to SN3 to be formed over the semiconductor substrate 1S (element isolation region STI) between the gate electrodes G1, G2 are prone to be formed into a film thickness less than the film thickness over the gate electrodes G1, G2. To describe specifically, it is assumed that the total film thickness of the laminated silicon nitride films SN1 to SN3 over the gate electrode G1 is T0, the total film thickness of the silicon nitride films SN1 to SN3 formed on the side wall of the sidewall SW is T1, and the total film thickness of the silicon nitride films SN1 to SN3 formed over the element isolation region STI between the gate electrodes G1, G2 is T2, as shown in FIG. 11.

Then, relationships T0>T1, T0>T2 hold. If it is assumed that the respective film thicknesses of the laminated silicon nitride films SN1 to SN3 to be formed on the side wall of the sidewall SW are t4 (<t1), t5 (<t1), and t6 (<t1), then T1 can be expressed as t4+t5+t6, that is, T1=t4+t5+t6. Similarly, if it is assumed that the respective film thicknesses of the silicon nitride films SN1 to SN3 formed over the element isolation region STI between the gate electrodes G1, G2 are t7 (<t1), t8 (<t1), and t9 (<t1), then T2 can be expressed as t7+t8+t9, that is T2=t7+t8+t9.

In the comparative examples the inventors of the present invention have discussed, as a result of that the film thickness of the silicon nitride films SN1 to SN3 over the gate electrode G1 is the same as described above, the aspect ratio in the region between the gate electrodes G1, G2 increases when the silicon nitride film SN3 is formed in the uppermost layer. That is, the aspect ratio between the gate electrodes G1, G2 increases more in the stage where the silicon nitride film SN1 is formed than that in the previous stage where the silicon nitride film SN1 is formed, and the aspect ratio further increases in the stage where the silicon nitride film SN2 is formed over the silicon nitride film SN1. That is, the aspect ratio between the gate electrodes G1, G2 increases as the silicon nitride films SN1 to SN3 are formed sequentially and when the silicon nitride film SN3 to be formed in the uppermost layer is embedded, the aspect ratio between the gate electrodes G1, G2 becomes greatest.

In addition, because the silicon nitride films SN1 to SN3 are not formed conformally, the coverage characteristic between the gate electrodes G1, G2 is deteriorated. The deterioration of the coverage characteristic in the present specification means that the shape of the surface of the silicon nitride films SN1 to SN3 is a vertical shape or inversely-tapered shape instead of a forwardly-tapered shape as a result of that the film thickness of the silicon nitride films SN1 to SN3 to be formed on the side wall of the gate electrodes G1, G2 and the film thickness of the silicon nitride films SN1 to SN3 to be formed over the semiconductor substrate 1S (element isolation region STI) between the gate electrodes G1, G2 are formed so as to be less than the film thickness over the gate electrodes G1, G2 when the silicon nitride films SN1 to SN3 are formed. For example, if the coverage characteristic of the silicon nitride film SN1 between the gate electrodes G1, G2 is deteriorated, the coverage characteristic of the silicon nitride film SN2 to be formed over the silicon nitride film SN1 is further deteriorated. This is because if the coverage characteristic of the silicon nitride film SN1, which will serve as a backing film when the silicon nitride film SN2 is formed, is deteriorated, the coverage characteristic of the silicon nitride film SN2 is further deteriorated, reflecting the deterioration of the coverage characteristic.

Because of this, the coverage characteristic of the silicon nitride film SN3 that is formed in the uppermost layer is deteriorated most among the silicon nitride films SN1 to SN3 because the silicon nitride film SN3 is formed over the silicon nitride film SN2, the coverage characteristic of which has been further deteriorated. Because of this, as shown in FIG. 11, the surface shape of the silicon nitride film SN3 to be embedded in the region between the gate electrodes G1, G2 is a vertical shape in which the taper angle erects instead of a forwardly-tapered shape. Due to this, the embedding characteristic of the silicon nitride film SN3 is deteriorated.

That is, the deterioration of the embedding characteristic of the silicon nitride films SN1 to SN3 occurs most noticeably in the silicon nitride film SN3 formed in the uppermost layer among the silicon nitride films SN1 to SN3. In particular, when the region (distance) between the gate electrode G1 and the gate electrodes G2 is narrowed and the aspect ratio is 1.4 or more and the total film thickness of the silicon nitride films SN1 to SN3 is ½ or more of the region (distance) between the gate electrode G1 and the gate electrode G2, the deterioration of the embedding characteristic of the silicon nitride film SN3 in the uppermost layer becomes noticeable.

Figure 12:
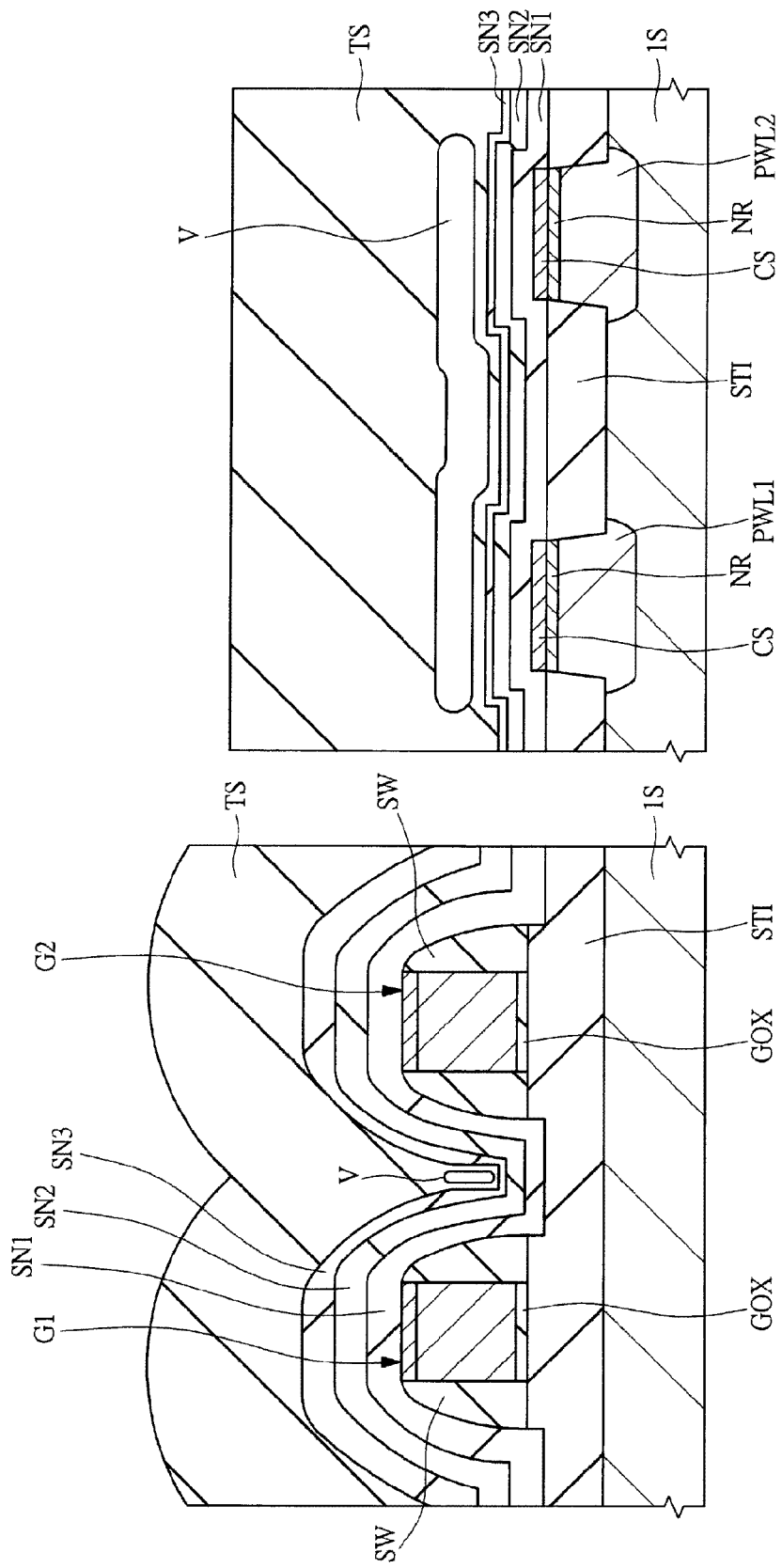
FIG. 12 is a section view showing the manufacturing process of a semiconductor device, following FIG. 11.

Subsequently, as shown in FIG. 12, the silicon oxide film TS is formed over the silicon nitride film SN3. At this time, because the embedding characteristic of the silicon nitride film SN3 formed between the gate electrodes G1, G2 has already been deteriorated, the silicon oxide film TS cannot be embedded sufficiently between the gate electrodes G1, G2 and a void V occurs. That is, because the surface shape of the silicon nitride film SN3 between the gate electrodes G1, G2 is a vertical shape instead of a forwardly-tapered shape, the reaction gas when the silicon oxide film TS is formed does not spread between the gate electrodes G1, G2 sufficiently, and thereby, the void V, which is a hollow part, occurs in the silicon oxide film TS.

Figure 13:
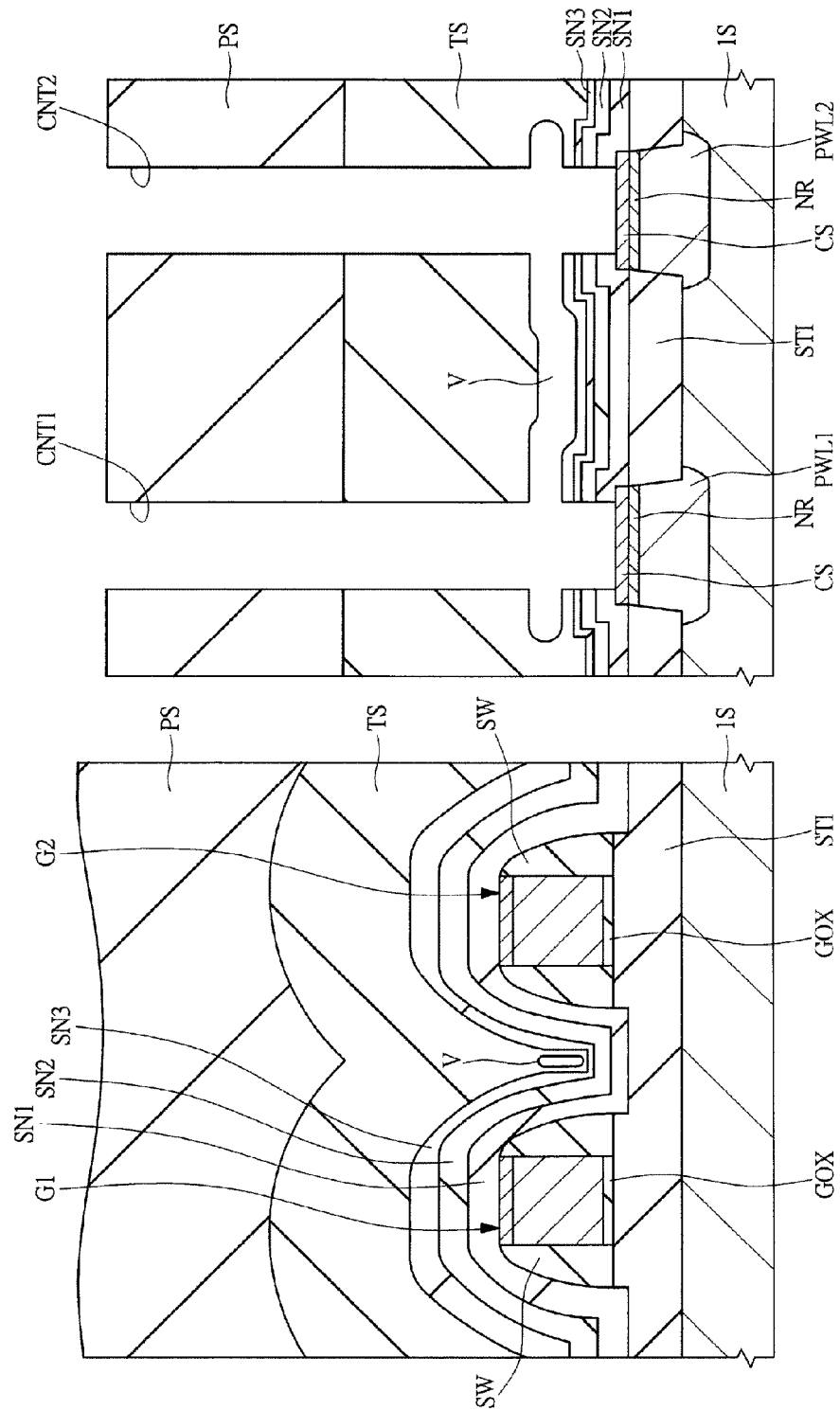
FIG. 13 is a section view showing the manufacturing process of a semiconductor device, following FIG. 12.

Thereafter, as shown in FIG. 13, a silicon oxide film PS is formed over the silicon oxide film TS. Then, the contact hole CNT1 and a contact hole CNT2 that penetrate through the silicon oxide film PS, the silicon oxide film TS, and the silicon nitride films SN1, SN2, SN3 and reach the nickel silicide film CS are formed using the photolithography technique and the etching technique. At this time, the contact hole CNT1 and the contact hole CNT2 are coupled by the void V.

Figure 14:
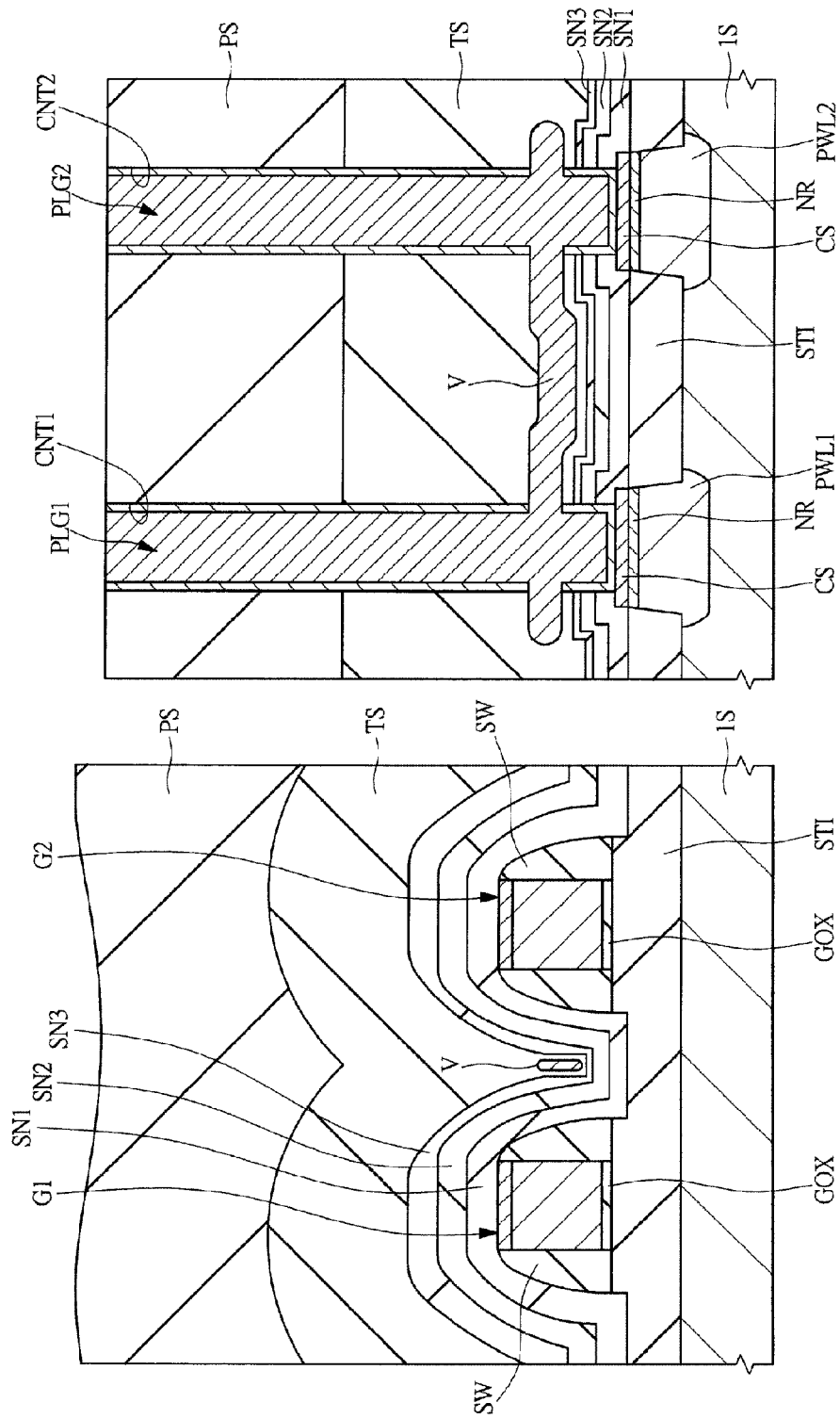
FIG. 14 is a section view showing the manufacturing process of a semiconductor device, following FIG. 13.

Next, as shown in FIG. 14, a plug PLG1 and a plug PLG2 are formed by embedding a barrier conductor film and a conductive film in the contact hole CNT1 and the contact hole CNT2. At this time, the barrier conductor film and the conductive film to be embedded in the contact hole. CNT1 and the contact hole CNT2 flow into the inside of the void V. As a result, the plug PLG1 formed by embedding the barrier conductor film and the conductive film in the contact hole CNT1 and the plug PLG2 formed by embedding the barrier conductor film and the conductive film in the contact hole CNT2 are electrically short-circuited via the conductive materials (the barrier conductor film and the conductive film) that have flowed into the void V. If different voltages are applied to the plugs PLG1, PLG2 that are short-circuited, the circuit malfunctions as a semiconductor device, and therefore, the production yields are reduced as a result.

As described above, in the comparative examples the inventors of the present invention have discussed, the deterioration of the coverage (deterioration of the embedding characteristic) occurs, causing the surface shape of the silicon nitride film SN3 to be embedded between the gate electrodes G1, G2 to have a vertical shape, and as a result, the void V occurs in the silicon oxide film TS to be formed over the silicon nitride film SN3. Then, when the conductive materials (the barrier conductor film and the conductive film) are embedded in the void V, the problem arises that a short circuit defect occurs between the neighboring plugs PLG1, PLG2.

Because of this, an object of the first embodiment is to improve the embedding characteristic of the silicon nitride film SN3 to be embedded between the gate electrodes G1, G2. In more detail, an object thereof is to prevent the void V from occurring in the silicon oxide film TS to be formed over the silicon nitride film SN3 by improving the embedding characteristic of the silicon nitride film SN3. By achieving the above-described objects, an effect can be obtained that a short circuit defect can be prevented from occurring in the neighboring plugs PLG1, PLG2 via the void V. In the first embodiment, in order to achieve the objects, a manufacturing method of the silicon nitride films SN1 to SN3 formed by lamination is devised. The technical idea of the first embodiment (manufacturing method of a semiconductor device) will be described below with reference to the drawings.

Figure 15:
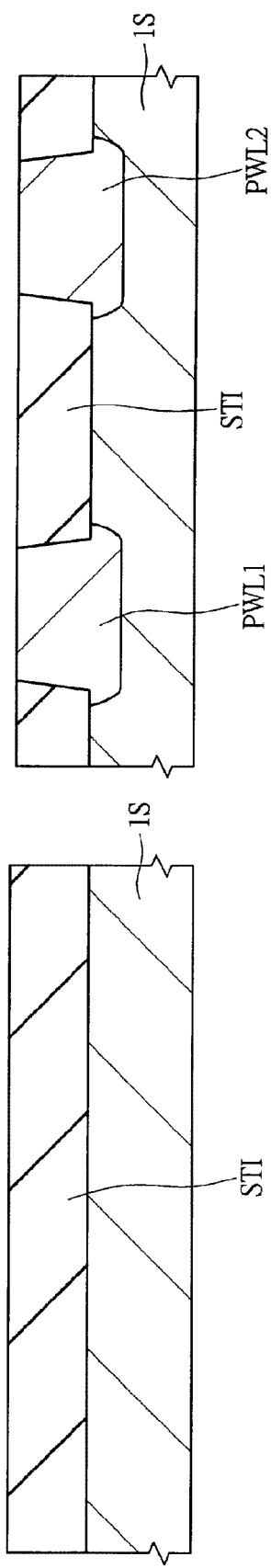
FIG. 15 is a section view showing a manufacturing process of a semiconductor device in a first embodiment of the present invention.

A manufacturing process of a semiconductor device in the first embodiment will be described basically using the section views cut along the B-B line in FIG. 2 and the section views cut along the C-C line in FIG. 2. First, as shown in FIG. 15, the semiconductor substrate 1S is prepared, which includes silicon single crystal into which impurities, such as boron (B), have been introduced. At this time, the semiconductor substrate 1S is in a state of a semiconductor wafer in the shape of substantially a disc. Then, the element isolation region STI that separates elements is formed in the MISFET formation region of the semiconductor substrate 1S. The element isolation region STI is provided in order to prevent interference between elements. It is possible to form the element isolation region STI using, for example, the LOCOS (local oxidation of silicon) method or the STI (shallow trench isolation) method. For example, in the STI method, the element isolation region STI is formed as follows. That is, an element separation groove is formed in the semiconductor substrate 1S using the photolithography technique and the etching technique. Then, a silicon oxide film is formed over the semiconductor substrate so as to be embedded in the element separation groove, and then the unwanted silicon oxide film formed over the semiconductor substrate is removed by the chemical mechanical polishing (CMP) method. Due to this, it is possible to form the element isolation region STI in which the silicon oxide film is embedded only in the element separation groove.

Next, a well is formed by introducing impurities in an active region separated by the element isolation region STI. For example, in the n-channel MISFET formation region of the active region, the p-type wells PWL1, PWL2 are formed. The p-type wells PWL1, PWL2 are formed by introducing p-type impurities, such as boron for example, into the semiconductor substrate by the ion injection method.

Subsequently, a channel formation semiconductor region (not shown schematically) is formed in the surface region of the p-type wells PWL1, PWL2. The channel formation semiconductor region is formed in order to adjust a threshold voltage for channel formation.

Next, as shown in FIG. 16, the gate insulating film GOX is formed over the semiconductor substrate 1S. It is possible to form the gate insulating film GOX by a silicon oxide film, for example, using the thermal oxidation method or the ISSG oxidation method. However, the gate insulating film GOX is not limited to the silicon oxide film, but can be modified in various ways, and the gate insulating film GOX may be formed from, for example, a silicon oxynitride film (SiON). That is, it may have a structure in which nitrogen is introduced into the gate insulating film GOX. The silicon oxynitride film has a significant effect for suppressing the occurrence of boundary surface level in the film and reducing electron trap compared to the silicon oxide film. As a result, it is possible to improve the hot-carrier resistance of the gate insulating film GOX and the insulation resistance. In addition, the silicon oxynitride film is more unlikely to allow impurities to penetrate therethrough compared to the silicon oxide film. Because of this, by using a silicon oxynitride film as the gate insulating film GOX, it is possible to suppress the variations in the threshold voltage resulting from the diffusion of impurities in the gate electrode to the side of the semiconductor substrate 1S. In order to form a silicon oxynitride film, for example, it is only required to perform thermal processing of the semiconductor substrate 1S in an atmosphere including nitrogen, such as NO, $NO_2$, and $NH_3$. It is also possible to obtain the same effect by performing thermal processing of the semiconductor substrate 1S in an atmosphere including nitrogen after forming the gate insulating film GOX including a silicon oxide film on the surface of the semiconductor substrate 1S, and introducing nitrogen into the gate insulating film GOX.

Further, it may also be possible to form the gate insulating film GOX by, for example, a high-k dielectric film the dielectric constant of which is higher than that of the silicon oxide film. Conventionally, from the standpoint that the insulation resistance is high, the electric/physical stability at the boundary surface between silicon and silicon oxide is excellent, etc., a silicon oxide film is used as the gate insulating film GOX. However, it has been demanded for the gate insulating film GOX to be extremely thin accompanying the miniaturization of element.

If such a thin silicon oxide film is used as the gate insulating film GOX, a so-called tunneling current is caused by electrons that flow through the channel of MISFET, tunneling the barrier wall formed from the silicon oxide film and flowing to the gate electrode.

Because of this, a material having a dielectric constant higher than that of the silicon oxide film is used and thereby a high-k dielectric film begins to be used recently, which has the same capacitance but is capable of increasing physical film thickness. With a high-k dielectric film, it is possible to increase the physical film thickness with the same capacitance, and therefore, the leak current can be reduced. In particular, although the silicon nitride film has a dielectric constant higher than that of the silicon oxide film, it is desirable to use a high-k dielectric film having a dielectric constant higher than that of the silicon nitride film in the first embodiment.

For example, as a high-k dielectric film having a dielectric constant higher than that of the silicon nitride film, a hafnium oxide film ($HfO_2$ film) can be used, which is one of hafnium oxides. Further, a HfAlO film may be used, which is a hafnium oxide film to which aluminum is added. Furthermore, instead of the hafnium oxide film, other hafnium-based insulating films, such as a hafnium aluminate film, a HfON film (hafnium oxynitride film), a HfSiO film (hafnium silicate film), a HfSiON film (hafnium silicon oxynitride film), and a HfAlO film, can be used. Furthermore, hafnium-based insulating films that have introduced oxides therein, such as tantalum oxide, niobium oxide, titanium oxide, zirconium oxide, lanthanum oxide, and yttrium oxide, can also be used. Because the hafnium-based insulating film has a dielectric constant higher than those of the silicon oxide film and the silicon oxynitride film, like the hafnium oxide film, the same effect as that when the hafnium oxide film is used can be obtained.

Next, the polysilicon film PF is formed over the gate insulating film GOX. It is possible to form the polysilicon film PF using, for example, the CVD method. Then, n-type impurities, such as phosphorus and arsenic, are introduced into the polysilicon film PF using the photolithography technique and the ion injection method.

Figure 17:
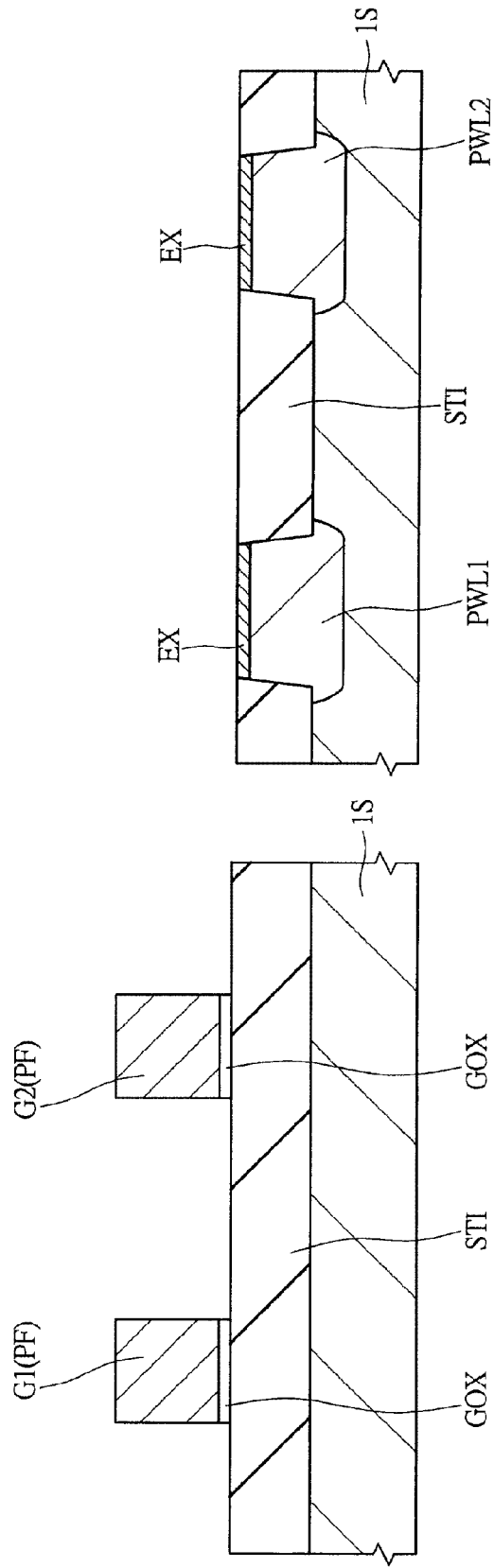
FIG. 17 is a section view showing the manufacturing process of a semiconductor device, following FIG. 16.

Next, as shown in FIG. 17, the gate electrodes G1, G2 are formed in the n-channel MISFET formation region by processing the polysilicon film PF by etching using a patterned resist film as a mask.

Here, into the polysilicon film PF of the gate electrodes G1, G2 in the n-channel MISFET formation region, n-type impurities have been introduced. Because of this, it is possible to set the work function value of the gate electrodes G1, G2 to a value in the vicinity of the conduction band of silicon (4.15 eV), and therefore, the threshold voltage of the n-channel MISFET can be reduced.

Subsequently, the shallow n-type impurity diffusion region EX in alignment with the gate electrodes G1, G2 of the n-channel MISFET is formed using the photolithography technique and the ion injection method. The shallow n-type impurity diffusion region EX is a semiconductor region.

Figure 18:
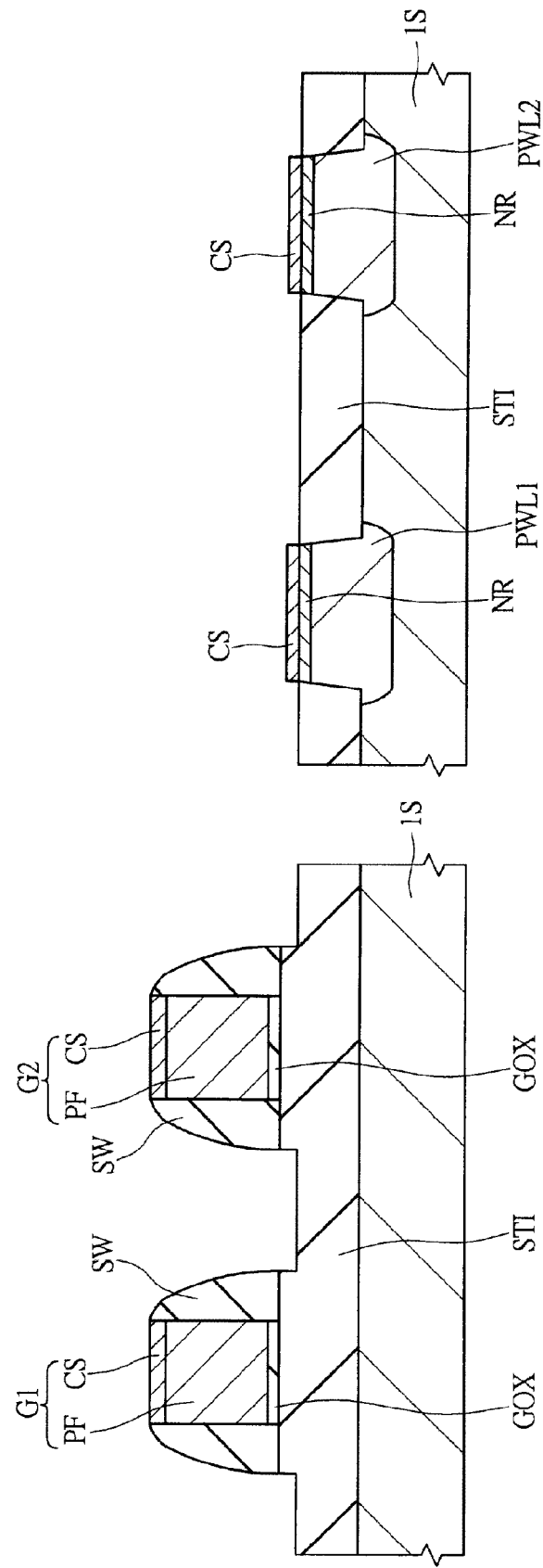
FIG. 18 is a section view showing the manufacturing process of a semiconductor device, following FIG. 17.

Next, as shown in FIG. 18, a silicon oxide film is formed over the semiconductor substrate 1S. It is possible to form the silicon oxide film using, for example, the CVD method. Then, the sidewall SW is formed on the side walls of the gate electrodes G1, G2 by performing anisotropic etching of the silicon oxide film. The sidewall SW is formed from a single layer film of silicon oxide film, however, this is not limited, and a silicon nitride film or a silicon oxynitride film may be used. It may also be possible to form the sidewall SW including a lamination film in which any of a silicon nitride film, a silicon oxide film, and a silicon oxynitride film is combined.

Subsequently, the deep n-type impurity diffusion region NR in alignment with the sidewall SW is formed in the n-channel MISFET formation region using the photolithography technique and the ion injection method. The deep n-type impurity diffusion region NR is a semiconductor region. The deep n-type impurity diffusion region NR and the shallow n-type impurity diffusion region EX form the source region. Similarly, the deep n-type impurity diffusion region NR and the shallow n-type impurity diffusion region EX form the drain region. By forming the source region and the drain region by the shallow n-type impurity diffusion region EX and the deep n-type impurity diffusion region NR as described above, it is possible to cause the source region and the drain region to have an LDD (Lightly Doped Drain) structure.

After the deep n-type impurity diffusion region NR is formed as described above, thermal processing at about 1,000° C. is performed. Due to this, the introduced impurities are activated.

Thereafter, a nickel film is formed over the semiconductor substrate 1S. At this time, the nickel film is formed so as to come into direct contact with the gate electrodes G1, G2. Similarly, the nickel film also comes into direct contact with the shallow n-type impurity diffusion region EX.

It is possible to form the nickel film using, for example, the sputtering method. Then, after the nickel film is formed, by performing thermal processing, the polysilicon film constituting the gate electrodes G1, G2 and the nickel film are reacted with each other to form the nickel silicide film CS. Due to this, the gate electrode G comes to have a lamination structure of the polysilicon film PF and the nickel silicide film CS. The nickel silicide film CS is formed in order to reduce the resistance of the gate electrodes G1, G2. Similarly, by the above-described thermal processing, also on the surface of the shallow n-type impurity diffusion region EX, silicon and the nickel film react with each other and the nickel silicide film CS is formed. Because of this, it is possible to make an attempt to reduce resistance both in the source region and in the drain region.

Then, the unreacted nickel film is removed from the semiconductor substrate 1S. In the first embodiment, the configuration is such that the nickel silicide film CS is formed, however, it may also be possible to form a cobalt silicide film, a titanium silicide film, and a platinum silicide film instead of the nickel silicide film CS.

Subsequently, in the first embodiment, over the semiconductor substrate 1S including the region (distance) between the gate electrodes G1, G2, a silicon nitride film is formed and the first embodiment is characterized by the method of forming the silicon nitride film. The characteristic will be described below.

Figure 19:
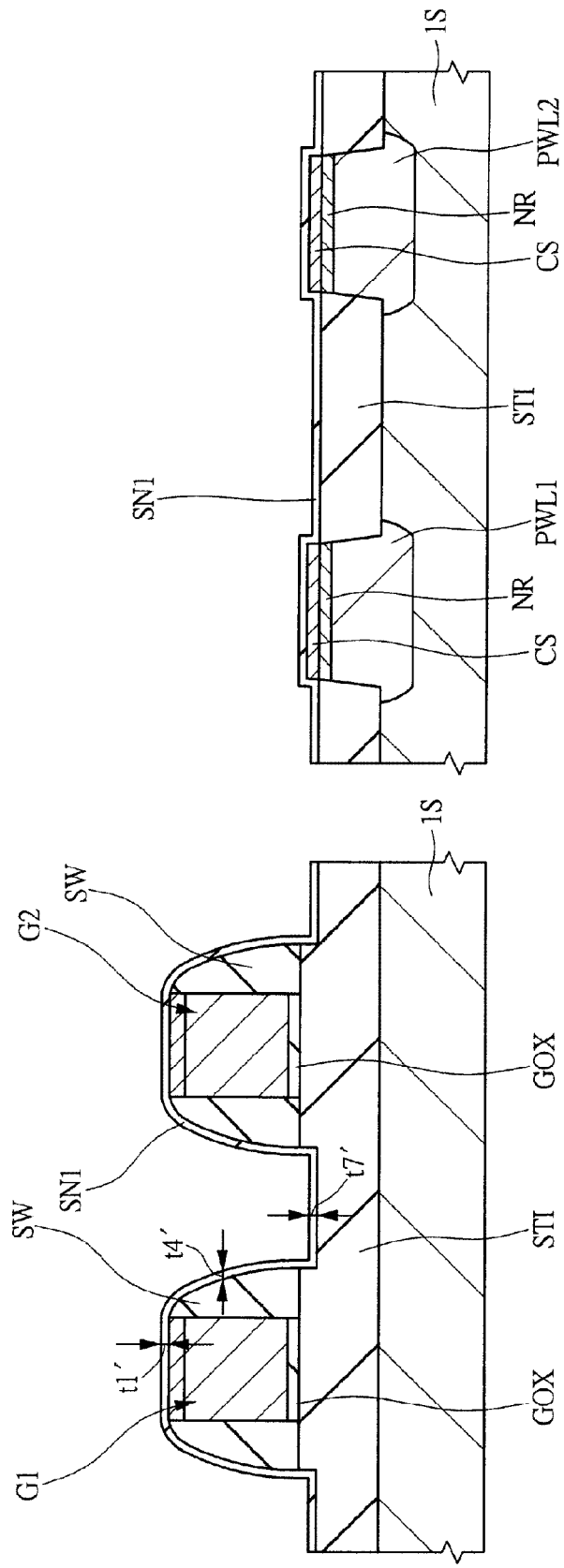
FIG. 19 is a section view showing the manufacturing process of a semiconductor device, following FIG. 18.

As shown in FIG. 19, over the semiconductor substrate 1S including the region between the gate electrodes G1, G2, the silicon nitride film SN1 is formed. It is possible to form the silicon nitride film SN1 using, for example, the plasma CVD method. Then, a film thickness $t1'$ of the silicon nitride film SN1 is less than the film thickness t1 explained in the comparative example. Due to this, the coverage characteristic of the silicon nitride film SN1 are improved. The reason for this will be described.

Ideally, it is desirable for the silicon nitride film SN1 to be formed conformally, however, in reality, it is not formed conformally. That is, in the silicon nitride film SN1, the film thickness is greatest over the gate electrodes G1, G2 and the film thickness of the silicon nitride film SN1 to be formed on the side walls of the gate electrodes G1, G2 and the film thickness of the silicon nitride film SN1 to be formed over the semiconductor substrate 1S (the element isolation region STI) between the gate electrodes G1, G2 are formed so as to be less than the film thickness over the gate electrodes G1, G2.

For example, in the first embodiment, it is assumed that the film thickness of the silicon nitride film SN1 over the gate electrode G1 is $t1'$, the film thickness of the silicon nitride film SN1 to be formed on the side wall of the sidewall SW is $t4'$, and the film thickness of the silicon nitride film SN1 to be formed over the element isolation region STI is $t7'$. In this case, relationships $t1'>t4'$ and $t1'>t7'$ hold. These are similar to the relationships $t1>t4$, $t1>t7$ in the comparative example.

Here, specifically, if it is assumed that $t4'$ can be expressed as $a \times t1'$ ($a<1$), that is, $t4'=a \times t1'$ ($a<1$) holds and $t7'$ can be expressed as $\beta \times t1'$ ($\beta<1$), that is, $t7'=\beta \times t1'$ ($\beta<1$) holds in the present embodiment, it is possible to express $t4=a \times t1$ ($a<1$), $t7=\beta \times t1$ ($\beta<1$) using the same $a$ and $\beta$ also in the comparative example. That is, both in the first embodiment and in the comparative example, it is assumed that the film thickness of the silicon nitride film SN1 formed on the side wall of the sidewall SW is $a$ times the film thickness of the silicon nitride film SN1 over the gate electrode G1 and the film thickness of the silicon nitride film SN1 formed over the element isolation region STI is $\beta$ times the film thickness of the silicon nitride film SN1 over the gate electrode G1.

At this time, the film thickness $t1'$ of the silicon nitride film SN1 over the gate electrode G1 in the first embodiment is less than the film thickness $t1$ of the silicon nitride film SN1 over the gate electrode G1 in the comparative example ($t1'<t1$). This means that relational expressions $t1'-t4'<t1-t4$, $t1'-t7'<t1-t7$ hold. In other words, relational expressions $(1-a) \times t1'<(1-a) \times t1$, $(1-\beta) \times t1'<(1-\beta) \times t1$ hold. These relational expressions mean that a difference between the film thickness of the silicon nitride film SN1 over the gate electrode G1 and the film thickness of the silicon nitride film SN1 formed on the side wall of the sidewall SW, or a difference between the film thickness of the silicon nitride film SN1 over the gate electrode G1 and the film thickness of the silicon nitride film SN1 formed over the element isolation region STI becomes smaller as the film thickness of the silicon nitride film SN1 becomes less. That is, in the first embodiment, it is possible to form the silicon nitride film SN1 to be embedded in the region between the gate electrodes G1, G2 more conformally by forming the silicon nitride film SN1 so that its film thickness is less than that in the comparative example. The fact that the silicon nitride film can be formed in a state close to a conformal state means that it is possible to form the silicon nitride film SN1 to be embedded in the region between the gate electrodes G1, G2 so that its surface shape is a comparatively smooth shape, such as a forwardly-tapered shape, and to improve the coverage characteristic of the silicon nitride film SN1.

After the silicon nitride film SN1 the coverage characteristic of which has been improved is formed as described above, the silicon nitride film SN1 is irradiated with ultraviolet rays. Due to this, it is possible to bake and densify the silicon nitride film SN1 and to generate tensile stress in the film of the silicon nitride film SN1. This process to irradiate ultraviolet rays is also called the UV cure process.

In the case of the n-channel MISFET, the wavelength of light emitted from a light source used in the process to irradiate ultraviolet rays is between 210 nm and 260 nm inclusive, and preferably, between 220 nm and 240 nm inclusive. It is possible to use at least one of excimer lamp, excimer laser, mercury lamp, xenon lamp, or deuterium lamp as such a light source. In particular, a light source that utilizes the light emission of KrCl excimer is preferable. The irradiation intensity of ultraviolet ray is set to 15 mW/cm$^2$ or more. When less than 15 mW/cm$^2$, it takes a long time to improve tensile stress, and therefore, the productivity is reduced. Further, it is preferable to set the temperature of the semiconductor substrate at the time of ultraviolet ray irradiation between 400° C. and 550° C. inclusive.

The ultraviolet ray irradiation process is not necessarily required and it is possible to generate the above-described tensile stress without performing the ultraviolet ray irradiation process. However, it is preferable to perform the ultraviolet ray irradiation process when to generate a greater stress. This also applies to the silicon nitride films SN2, SN3, to be described later.

Figure 20:
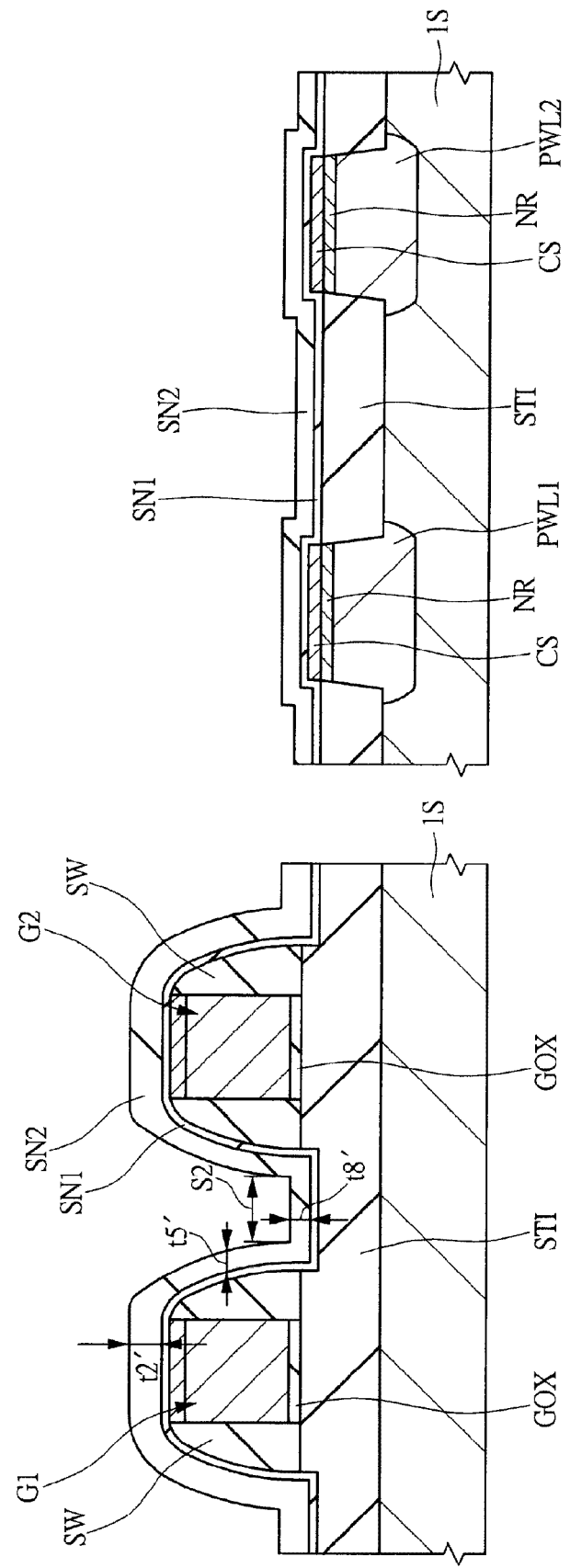
FIG. 20 is a section view showing the manufacturing process of a semiconductor device, following FIG. 19.

Next, as shown in FIG. 20, the silicon nitride film SN2 is formed over the silicon nitride film SN1. It is possible to form the silicon nitride film SN2 using, for example, the plasma CVD method. A film thickness t2' of the silicon nitride film SN2 is the same as the film thickness t1 (=t2) of the silicon nitride film SN2 described in the comparative example (t2'=t1). In other words, in the first embodiment, the film thickness t2' of the silicon nitride film SN2 is greater than the film thickness t1' of the silicon nitride film SN1.

For example, in the first embodiment, it is assumed that the film thickness of the silicon nitride film SN2 over the gate electrode G1 is t2', the film thickness of the silicon nitride film SN2 formed on the side wall of the sidewall SW is t5', and the film thickness of the silicon nitride film SN2 formed over the element isolation region STI is t8'. In this case, relationships t2'>t5' and t2'>t8' hold. These are similar to the relationships t1>t5, t1>t8 in the comparative example.

However, in the first embodiment, the coverage characteristic of the silicon nitride film SN1, which is a backing film, has been improved compared to the comparative example, and therefore, the coverage characteristic of the silicon nitride film SN2 formed over the silicon nitride film SN1 is also improved. That is, in the first embodiment, it is possible to improve the surface shape of the silicon nitride film SN2 to be embedded in the region between the gate electrodes G1, G2 into a smoother, forwardly-tapered shape than the surface shape of the silicon nitride film SN2 in the comparative example. In other words, both in the first embodiment and in the comparative example, the silicon nitride films SN2 having the same film thickness are formed, however, the coverage characteristic of the backing film (the silicon nitride film SN1) in the first embodiment has been more improved than that of the backing film (the silicon nitride film SN1) in the comparative example, and therefore, it is possible to improve the surface shape of the silicon nitride film SN2 in the first embodiment more than that of the silicon nitride film SN2 in the comparative example.

What is more important in the first embodiment is that the total film thickness of the thickness of the silicon nitride film SN1 and the thickness of the silicon nitride film SN2 is less than that in the comparative example. That is, the film thickness of the silicon nitride film SN1 is less than ⅓ of the total film thickness of the silicon nitride films SN1 to SN3. For example, if the film thickness over the gate electrode G1 is considered, the film thickness of the silicon nitride film SN1 in the first embodiment is t1' and the film thickness of the silicon nitride film SN2 is t2' (=t1). From this, over the gate electrode G1, the total film thickness of the silicon nitride film SN1 and the silicon nitride film SN2 is t1'+t2'. On the other hand, if the film thickness over the gate electrode G1 in the comparative example is considered, the film thickness of the silicon nitride film SN1 and the film thickness of the silicon nitride film SN2 are both t1, and therefore, the total film thickness of the silicon nitride film SN1 and the silicon nitride film SN2 is 2t1. Because of this, if the relationship of film thickness t1'<t1 is taken into consideration, the total film thickness of the silicon nitride film SN1 and the silicon nitride film SN2 is less in the first embodiment than in the comparative example. The film thickness over the gate electrode G1 is considered as described above, and the silicon nitride film SN1 and the silicon nitride film SN2 to be formed on the side wall of the sidewall SW can also be considered in a similar manner.

Consequently, a distance S2 between the sidewall SW formed on the side wall of the gate electrode G1 and the sidewall SW formed on the side wall of the gate electrode G2 is greater in the first embodiment than in the comparative example. This means that the aspect ratio in the region between the gate electrodes G1, G2 is smaller in the first embodiment than in the comparative example in the state where the silicon nitride film SN2 is formed. That the aspect ratio becomes smaller means that the embedding characteristic of a film is improved more, and therefore, according to the first embodiment, it is possible to improve the embedding characteristic of a film to be formed over the silicon nitride film SN2.

As described above, according to the first embodiment, it can be seen that it is possible to reduce the aspect ratio between the gate electrodes G1, G2 as well as improving the coverage characteristic of the silicon nitride film SN2 in the stage where the silicon nitride film SN1 and the silicon nitride film SN2 are laminated.

Subsequently, after the silicon nitride film SN2 is formed over the silicon nitride film SN1, the silicon nitride film SN2 is irradiated with ultraviolet rays. The conditions of the ultraviolet ray irradiation are the same as those under which the silicon nitride film SN1 is irradiated. Due to this, it is possible to bake and densify the silicon nitride film SN2 and to generate tensile stress in the film of the silicon nitride film SN2.

Figure 21:
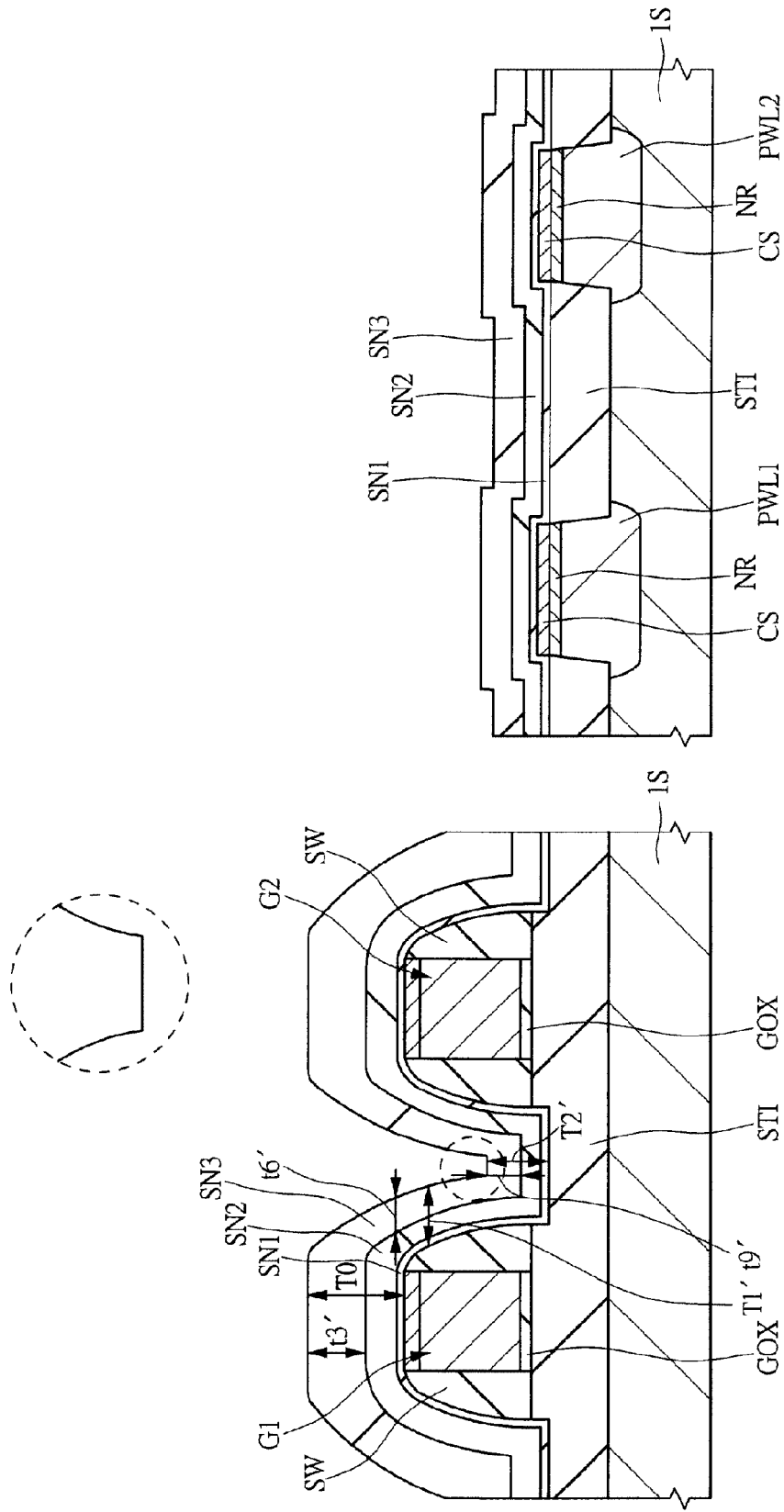
FIG. 21 is a section view showing the manufacturing process of a semiconductor device, following FIG. 20.

Next, as shown in FIG. 21, the silicon nitride film SN3 is formed over the silicon nitride film SN2. It is possible to form the silicon nitride film SN3 using, for example, the plasma CVD method. A film thickness t3' of the silicon nitride film SN3 is greater than the film thickness t1 (=t3) of the silicon nitride film SN3 described in the comparative example (t3'>t1). In other words, in the first embodiment, the film thickness t3' of the silicon nitride film SN3 is greater than the film thickness t2' of the silicon nitride film SN2 and the film thickness t1' of the silicon nitride film SN1. Then, in the first embodiment also, the total film thickness of the film thickness t1' of the silicon nitride film SN1, the film thickness t2' of the silicon nitride film SN2, and the film thickness t3' of the silicon nitride film SN3 is T0, the same as that in the comparative example. That is, both in the first embodiment and in the comparative example, the total film thickness of the silicon nitride films SN1 to SN3 is T0 and in the first embodiment also, it is possible to generate tensile stress similar to that in the comparative example. Specifically, in the first embodiment also, it is possible to apply tensile stress of 1.3 GPa to 1.7 GPa to the n-channel MISFET by forming the silicon nitride films SN1 to SN3. At this time, the total film thickness of the silicon nitride films SN1 to SN3 to be formed on the side wall of the sidewall SW is both T1' and the total film thickness of the silicon nitride films SN1 to SN3 to be formed on the element isolation region STI is both T2'.

In the first embodiment, it is assumed that the film thickness of the silicon nitride film SN3 over the gate electrode G1 is t3', the film thickness of the silicon nitride film SN3 formed on the side wall of the sidewall SW is t6', and the film thickness of the silicon nitride film SN3 formed over the element isolation region STI is t9'. In this case, relationships t3'>t6' and t3'>t9' hold. These are similar to the relationships t1>t6, t1>t9 in the comparative example.

In the first embodiment, however, the coverage characteristic of the silicon nitride film SN2, which is a backing film, has been improved and at the same time, the aspect ratio (the aspect ratio after the silicon nitride film SN2 is formed) in the region between the gate electrodes G1, G2 is reduced compared to the comparative example, and therefore, the coverage characteristic is improved and the coverage characteristic of the silicon nitride film SN3 to be formed over the silicon nitride film SN2 with a small aspect ratio is also improved. That is, in the first embodiment, it is possible to improve the surface shape of the silicon nitride film SN3 to be embedded in the region between the gate electrodes G1, G2 into a smoother, forwardly-tapered shape than the surface shape of the silicon nitride film SN3 in the comparative example. In other words, while the surface shape of the silicon nitride film SN3 is a vertical shape in the comparative example, in the first embodiment, it is possible to improve the surface shape of the silicon nitride film SN3 in the first embodiment more than the surface shape of the silicon nitride film SN3 in the comparative example because the coverage characteristic of the backing film (the silicon nitride film SN2) and the aspect ratio have been improved more than those in the comparative example.

Here, the film thickness t3' of the silicon nitride film SN3 in the first embodiment is greater than the film thickness t1 of the silicon nitride film SN3 in the comparative example. That is, the film thickness of the silicon nitride film SN3 is greater than 1/3 of the total film thickness of the silicon nitride films SN1 to SN3. The result of the discussion made by the inventors of the present invention with this point focused on is described below. As described in the formation process of the silicon nitride film SN1, it is possible to form the silicon nitride film SN1 to be embedded in the region between the gate electrodes G1, G2 more conformally by forming the silicon nitride film SN1 so as to be thin. Consequently, the inventors of the present invention have discussed whether the coverage characteristic of the silicon nitride film SN3 in the first embodiment is deteriorated more than the coverage characteristic of the silicon nitride film SN3 in the comparative example because the film thickness t3' of the silicon nitride film SN3 in the first embodiment is greater than the film thickness t1 of the silicon nitride film SN3 in the comparative example.

However, the prerequisites for the formation of a film are different between the silicon nitride film SN1 and the silicon nitride film SN3. That is, when the silicon nitride film SN1 is formed, the semiconductor substrate 1S including the region between the gate electrodes G1, G2 is a backing. The backing in the first embodiment is the same as that in the comparative example. Based on the prerequisite that the backing is the same, it is possible to form the silicon nitride film SN1 to be embedded in the region between the gate electrodes G1, G2 more conformally by reducing the film thickness.

On the other hand, when the silicon nitride film SN3 is formed, the backing film is the silicon nitride film SN2 and the coverage characteristic of the silicon nitride film SN2, which serves as a backing film, will play an important role. That is, while in the comparative example, the coverage characteristic of the silicon nitride film SN2, which is a backing film, is deteriorated, in the first embodiment, the coverage characteristic (characteristic that the surface shape of the silicon nitride film SN2 is a smooth, forwardly-tapered shape) of the silicon nitride film SN2, which is a backing film, has been improved and at the same time, the aspect ratio between the gate electrodes G1, G2 in the stage where the silicon nitride film SN2 is formed has also been reduced. Because of this, in the case of the silicon nitride film SN3, the state of the silicon nitride film SN2, which is a backing film, is quite different, and therefore, it is not possible to determine whether or not the coverage characteristic of the silicon nitride film SN3 is excellent only from the film thickness of the formed silicon nitride film SN3. In particular, it has been found that the state of the silicon nitride film SN2, which is a backing film, plays an important role in affecting the coverage characteristic of the silicon nitride film SN3.

Subsequently, after the silicon nitride film SN3 is formed over the silicon nitride film SN2, the silicon nitride film SN3 is irradiated with ultraviolet rays. The condition of the ultraviolet ray irradiation is the same as that under which the silicon nitride film SN1 is irradiated. Due to this, it is possible to bake and densify the silicon nitride film SN3 and to generate tensile stress in the film of the silicon nitride film SN3.

The stress generated from the silicon nitride film irradiated with ultraviolet rays becomes greater in proportion to the film thickness. That is, in the first embodiment, the stress generated from the silicon nitride film SN3 is greater than the stress generated from the silicon nitride film SN2 and the stress generated from the silicon nitride film SN2 is greater than the stress generated from the silicon nitride film SN1.

As described above, the characteristics of the first embodiment lie in the configuration of the silicon nitride films SN1 to SN3 formed into a lamination, in which the film thickness becomes less in order from the silicon nitride film SN3 in the upper layer to the silicon nitride film SN1 in the lower layer while the total film thickness is kept constant, instead of that the respective film thicknesses of the silicon nitride films SN1 to SN3 are constant values. Due to this, it is possible to improve the embedding characteristic of the silicon nitride film SN3 in the uppermost layer in particular, while ensuring the tensile stress of the silicon nitride films SN1 to SN3, which makes effective the strained silicon technique.

In particular, according to the first embodiment, even when the region (distance) between the gate electrode G1 and the gate electrode G2 is narrowed and the aspect ratio is 1.4 or more and the total film thickness of the silicon nitride films SN1 to SN3 is 1/2 or more of the region (distance) between the gate electrode G1 and the gate electrode G2, it is possible to exhibit the noticeable effect that the embedding characteristic of the silicon nitride film SN3 in the uppermost layer can be improved.

Next, an interlayer insulating film is formed over the silicon nitride film SN3. In the first embodiment, the silicon oxide film TS and the silicon oxide film PS are illustrated as an interlayer insulating film. The interlayer insulating film is formed so as to be sufficiently greater in the film thickness than the silicon nitride films SN1 to SN3.

Figure 22:
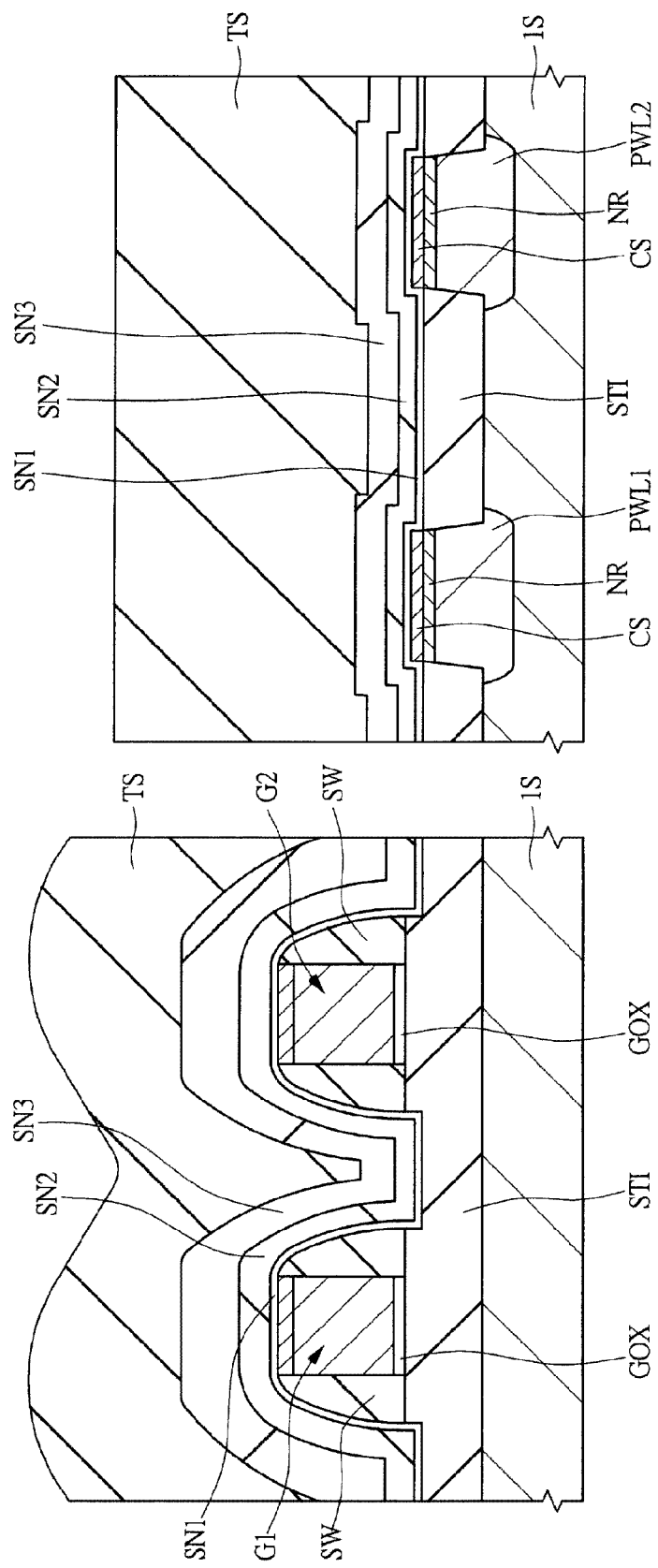
FIG. 22 is a section view showing the manufacturing process of a semiconductor device, following FIG. 21.

First, as shown in FIG. 22, the silicon oxide film TS is formed over the silicon nitride film SN3. It is possible to form the silicon oxide film TS using, for example, the plasma CVD method that uses ozone ($O_3$) and TEOS (tetra ethyl ortho silicate) as its raw materials. At this time, in the first embodiment, the embedding characteristic of the silicon nitride film SN3 formed between the gate electrodes G1, G2 has been improved, and therefore, it is possible to embed the silicon oxide film TS between the gate electrodes G1, G2 sufficiently. Because of this, in the first embodiment, it is possible to prevent a hollow part (void) from being formed in the silicon oxide film TS between the gate electrodes G1, G2. That is, the surface shape of the silicon nitride film SN3 between the gate electrodes G1, G2 is a comparatively smooth, forwardly-tapered shape, instead of a vertical shape, and therefore, the reaction gas when forming the silicon oxide film TS spreads sufficiently between the gate electrodes G1, G2, and thereby, it is possible to prevent the occurrence of a void in the silicon oxide film TS.

Figure 23:
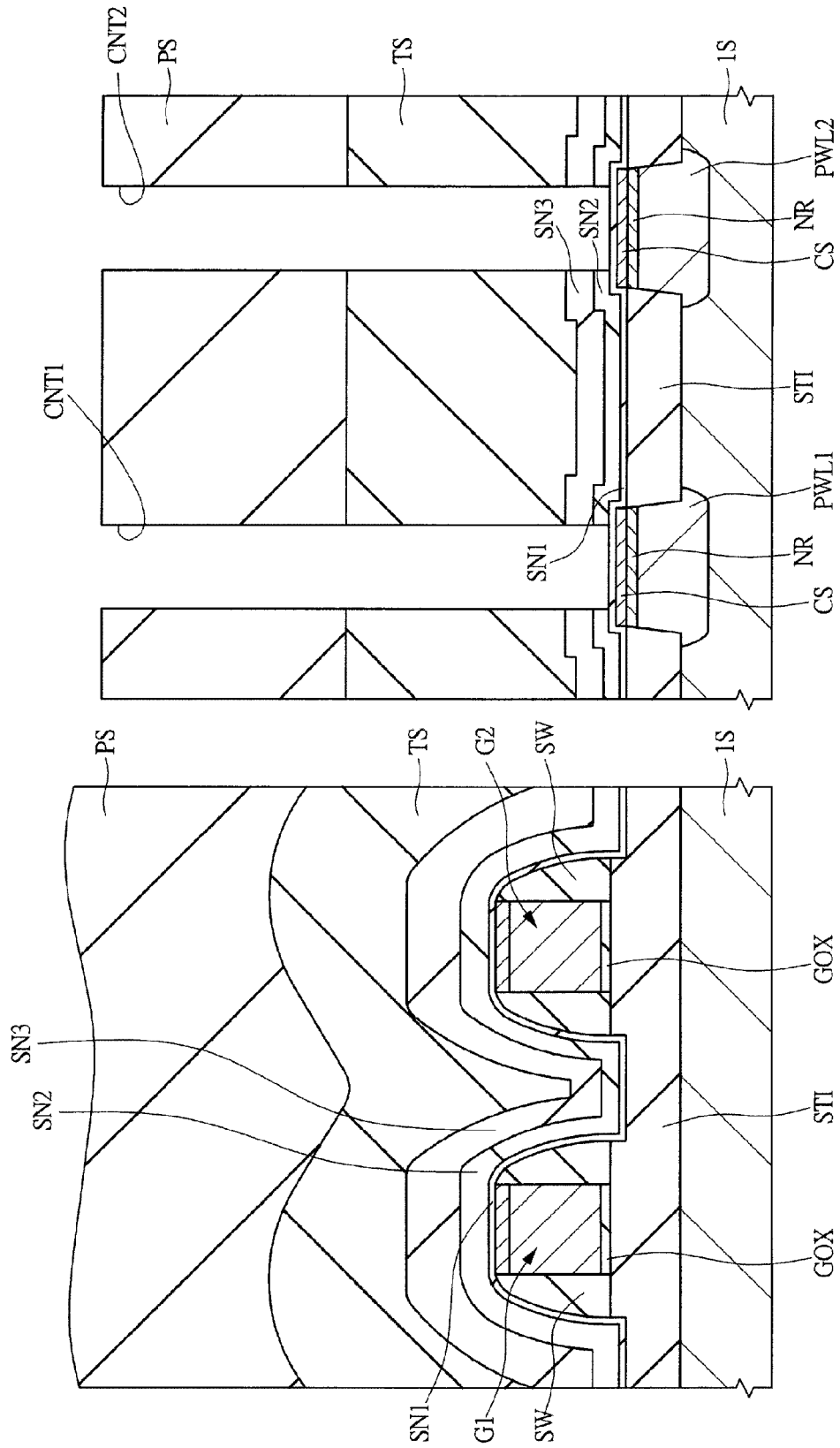
FIG. 23 is a section view showing the manufacturing process of a semiconductor device, following FIG. 22.

Thereafter, as shown in FIG. 23, the silicon oxide film PS is formed over the silicon oxide film TS. It is possible to form the silicon oxide film PS using, for example, the plasma CVD method that uses TEOS as its raw material. Then, the contact hole CNT1 and the contact hole CNT2 that penetrate through the silicon oxide film PS, the silicon oxide film TS, and the silicon nitride films SN1, SN2, SN3 and reach the nickel silicide film CS are formed using the photolithography technique and the etching technique.

Figure 24:
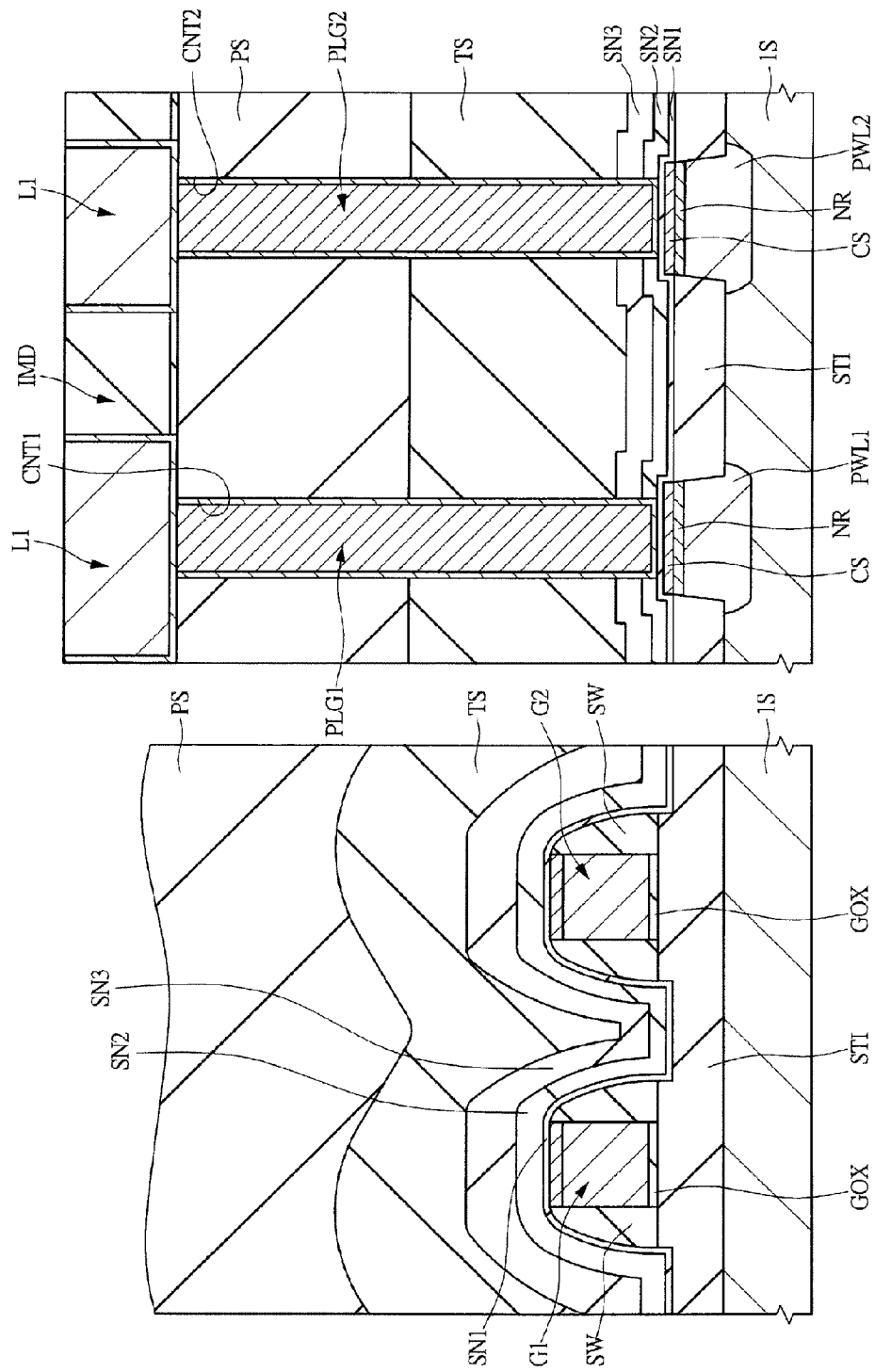
FIG. 24 is a section view showing the manufacturing process of a semiconductor device, following FIG. 23.
Figure 25:
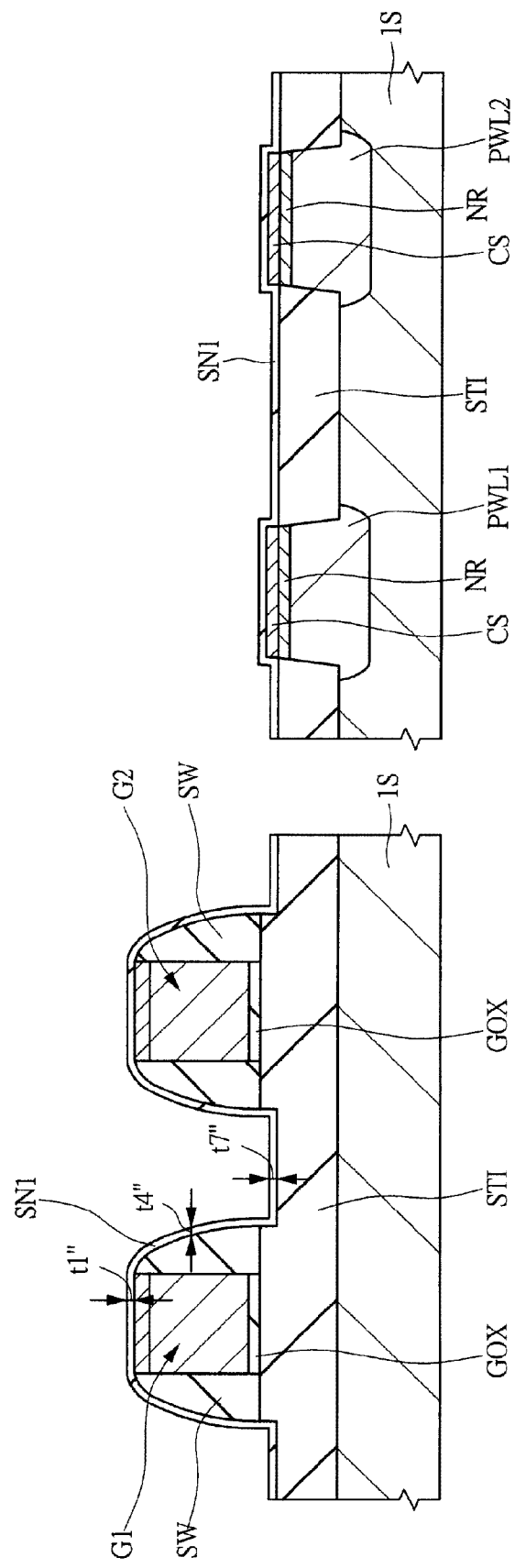
FIG. 25 is a section view showing a manufacturing process of a semiconductor device in a second embodiment of the present invention.

Next, as shown in FIG. 24, a titanium/titanium nitride film is formed over the silicon oxide film PS including the bottom and inner wall of the contact holes CNT1, CNT2. The titanium/titanium nitride film includes a laminated film of a titanium film and a titanium nitride film and can be formed using, for example, the sputtering method. The titanium/titanium nitride film has so-called barrier properties that prevent tungsten, which is a material of a film to be embedded in the later process, from diffusing into silicon.

Subsequently, a tungsten film is formed over the entire main surface of the semiconductor substrate 1S so as to be embedded in the contact holes CNT1, CNT2. It is possible to form the tungsten film using, for example, the CVD method. Then, it is possible to form the plugs PLG1, PLG2 by removing the unwanted titanium/titanium nitride film and tungsten film formed over the silicon oxide film PS using, for example, the CMP method.

Thereafter, an interlayer insulating film IMD including a thin silicon carbonitride film and a thick silicon oxide film is formed over the silicon oxide film PS and the plugs PLG1, PLG2. Subsequently, the film is patterned using the photolithography technique and the etching technique and the silicon oxide film is etched using the silicon carbonitride film as an etching stopper. Subsequently, a wire groove is formed in the interlayer insulating film IMD by etching the silicon carbonitride film. Subsequently, a barrier metal film, such as tantalum nitride or tantalum, is formed in the wire groove and a conductive film including copper as its principal component is formed over the barrier metal film using the plating method etc. Subsequently, a wire L1 embedded in the interlayer insulating film is completed by removing the copper film and the barrier metal film outside the wire groove using the CMP method etc. After that, a multilayer wire is formed in the upper layer of the wire L1, however, its description is omitted here. In this manner, it is possible to form a semiconductor device in the first embodiment finally.

As described above, in the first embodiment, it is possible to improve the embedding characteristic of the silicon nitride film SN3 to be embedded between the gate electrodes G1, G2. As a result, it is possible to obtain the noticeable effects that a void can be prevented from occurring in the silicon oxide film TS formed over the silicon nitride film SN3 and that a short circuit defect can be prevented from occurring between the plugs PLG1, PLG2 neighboring each other via a void. Consequently, it is possible to improve the reliability of a semiconductor device even if the downsizing of the semiconductor device is advanced.

Second Embodiment

In the first embodiment described above, the technical idea is described, which is developed from the standpoint that the improvement of the coverage characteristic of the silicon nitride film SN2, which serves as a backing film when the silicon nitride film SN3 is formed, and the reduction in the aspect ratio are realized. In a second embodiment, a technical idea will be described, which aims at the further improvement of the coverage characteristic of the silicon nitride film SN2, which is a backing film, without positively taking into consideration the reduction in the aspect ratio.

FIG. 25 to FIG. 30 are section views illustrating a manufacturing process of a semiconductor device in the second embodiment. On the left-hand side in FIG. 25 to FIG. 30, the section view along the B-B line in FIG. 2 is shown and on the right-hand side in FIG. 25 to FIG. 30, the section view along the C-C line in FIG. 2 is shown.

First, a MISFET is formed over the semiconductor substrate 1S through the same processes as those in the first embodiment. Subsequently, the silicon nitride film SN1 is formed over the semiconductor substrate 1S including the region between the gate electrodes G1, G2. It is possible to form the silicon nitride film SN1 using, for example, the plasma CVD method. In the second embodiment, the silicon nitride film SN1 is formed at, preferably, a temperature as high as possible but not exceeding 500° C. Specifically, the film-formation temperature is between 300° C. and 500° C. inclusive. Most preferably, the formation temperature is between 400° C. and 500° C. inclusive. A film thickness t1" of the silicon nitride film SN1 is less than the film thickness t1 described in the comparative example. Due to this, the coverage characteristic of the silicon nitride film SN1 is improved. The reason for that will be described.

As described in the first embodiment, the difference between the film thickness of the silicon nitride film SN1 over the gate electrode G1 and the film thickness of the silicon nitride film SN1 to be formed on the side wall of the sidewall SW, or the difference between the film thickness of the silicon nitride film SN1 over the gate electrode G1 and the film thickness of the silicon nitride film SN1 to be formed over the element isolation region STI becomes less as the film thickness of the silicon nitride film SN1 becomes less. That is, also in the second embodiment, it is possible to form the silicon nitride film SN1 to be embedded in the region between the gate electrodes G1, G2 more conformally by forming the silicon nitride film SN1 so as to have a film thickness less than that in the comparative example. That it is possible to form the silicon nitride film in a state close to a conformal state means that it is possible to improve the surface shape of the silicon nitride film SN1 to be embedded in the region between the gate electrodes G1, G2 into a comparatively smooth shape, that is, a forwardly-tapered shape and to improve the coverage characteristic of the silicon nitride film SN1. This is the same as the first embodiment described above.

Further, in the second embodiment, the silicon nitride film SN1 is formed at a temperature as high as possible but not exceeding 500° C. and this also improves the coverage characteristic of the silicon nitride film SN1 considerably. This is because if the film is formed at a temperature as high as possible, the reaction gas moves positively and as a result of that, even the region between the gate electrodes G1, G2 with a high aspect ratio is filled sufficiently with the reaction gas and the silicon nitride film SN1 is formed sufficiently in the region.

Because of this, in the second embodiment, by the synergy effect of that the film thickness of the silicon nitride film SN1 is reduced and that the silicon nitride film SN1 is formed at a temperature as high as possible but not exceeding 500° C., it is possible to form the silicon nitride film SN1 in a state almost close to a conformal state. For example, in the second embodiment, if it is assumed that the film thickness of the silicon nitride film SN1 over the gate electrode G1 is t1", the film thickness of the silicon nitride film SN1 to be formed on the side wall of the sidewall SW is t4", and the film thickness of the silicon nitride film SN1 to be formed over the element isolation region STI is t7", then it is possible to have a relationship t1"~t4"~t7".

Here, the reason for that the film-formation temperature of the silicon nitride film SN1 is set to 500° C. or lower will be described. When the silicon nitride film SN1 is formed, the n-channel MISFET having the gate electrodes G1, G2 is already formed (the p-channel MISFET is also formed, although not shown schematically). Because of this, on the surface of the gate electrodes G1, G2 and on the surface of the deep n-type impurity diffusion region NR, the nickel silicide film CS is formed. The nickel silicide film CS recondenses if a temperature of 500° C. or higher is applied and at the worst, the breakage of the gate electrodes G1, G2 may occur. Because of this, it is difficult to apply a thermal load of 500° C. or higher after the nickel silicide film CS is formed from the standpoint that the reliability of a semiconductor device should be ensured. That is, the silicon nitride film SN1 is formed after the nickel silicide film CS is formed, and therefore, it is not possible to set the film formation temperature of the silicon nitride film SN1 to 500° C. or higher.

In the second embodiment, by setting the film formation temperature of the silicon nitride film SN1 as high as possible but not exceeding 500° C., it is possible to further improve the coverage characteristic of the silicon nitride film SN1 without recondensing the nickel silicide film CS.

In the manner described above, after the silicon nitride film SN1 having the improved coverage characteristic is formed, the silicon nitride film SN1 is irradiated with ultraviolet rays. Due to this, it is possible to bake and densify the silicon nitride film SN1 and generate tensile stress in the film of the silicon nitride film SN1. The description of the ultraviolet ray irradiation process is the same as that given in the first embodiment.

Figure 26:
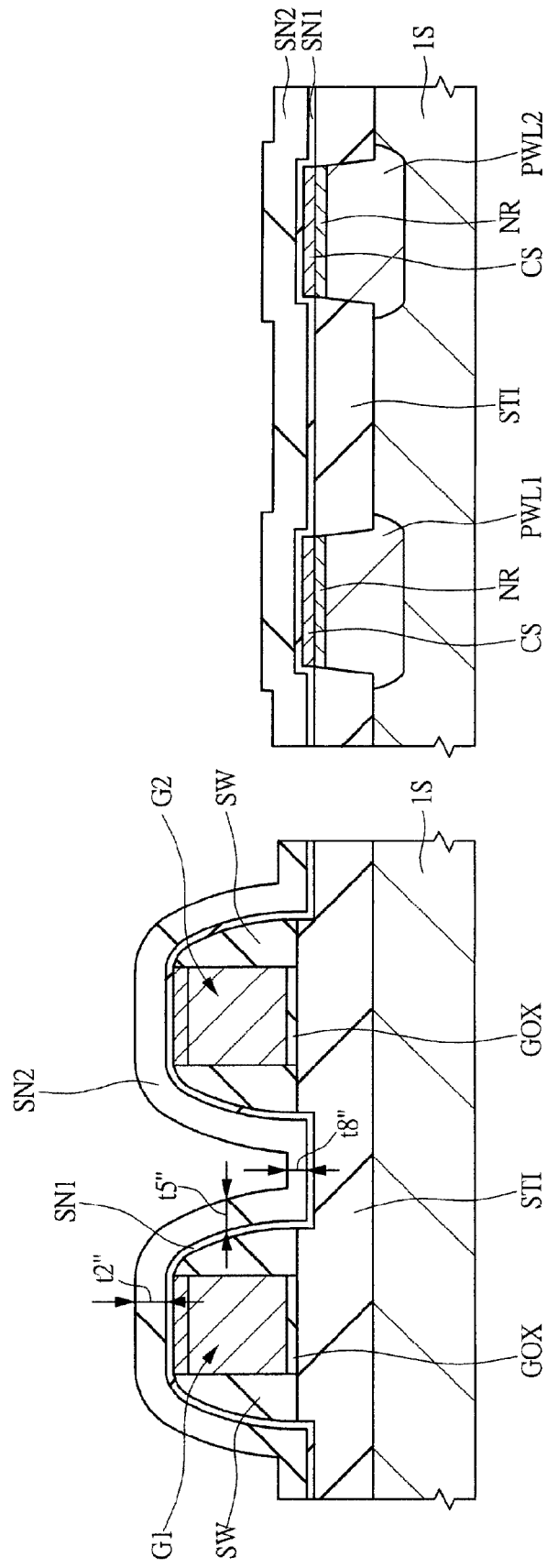
FIG. 26 is a section view showing the manufacturing process of a semiconductor device, following FIG. 25.

Next, as shown in FIG. 26, the silicon nitride film SN2 is formed over the silicon nitride film SN1. It is possible to form the silicon nitride film SN2 using, for example, the plasma CVD method. In the second embodiment, the silicon nitride film SN2 is formed at a film formation temperature as high as possible but not exceeding 500° C. Specifically, the film formation temperature is between 300° C. and 500° C. inclusive. Most preferably, it is between 400° C. and 500° C. inclusive.

The film thickness t2" of the silicon nitride film SN2 is the same as the film thickness t1 (=t2) of the silicon nitride film SN2 described in the comparative example (t2"=t1). In other words, in the second embodiment, the film thickness t2" of the silicon nitride film SN2 is greater than the film thickness t1" of the silicon nitride film SN1.

In the second embodiment, as in the film formation process of the silicon nitride film SN1, by setting the film formation temperature of the silicon nitride film SN2 as high as possible but not exceeding 500° C., it is possible to form the silicon nitride film SN2 in a state almost close to a conformal state. For example, in the second embodiment, if it is assumed that the film thickness of the silicon nitride film SN2 over the gate electrode G1 is t2", the film thickness of the silicon nitride film SN2 to be formed on the side wall of the sidewall SW is t5", and the film thickness of the silicon nitride film SN2 to be formed over the element isolation region STI is t8", then it is possible to have a relationship t2"~t5"~t8".

In the second embodiment, the coverage characteristic of the silicon nitride film SN1, which is a backing film, has been improved more than those in the comparative example and at the same time, the film formation temperature of the silicon nitride film SN2 has been set to a temperature as high as possible but not exceeding 500° C., and therefore, the coverage characteristic of the silicon nitride film SN2 is also improved considerably. That is, it is possible to improve the surface shape of the silicon nitride film SN2 to be embedded in the region between the gate electrodes G1, G2 into a smoother, forwardly-tapered shape than the surface shape of the silicon nitride film SN2 in the comparative example. In other words, both in the second embodiment and in the comparative example, the silicon nitride film SN2 having the same film thickness is formed, however, the coverage characteristic of the backing film (silicon nitride film SN1) in the second embodiment has been improved more than that of the backing film (silicon nitride film SN1) in the comparative example and at the same time, the film formation temperature of the silicon nitride film SN2 has been set higher, and therefore, it is possible to improve the surface shape of the silicon nitride film SN2 in the second embodiment more than the surface shape of the silicon nitride film SN2 in the comparative example.

Subsequently, after the silicon nitride film SN2 is formed over the silicon nitride film SN1, the silicon nitride film SN2 is irradiated with ultraviolet rays. Due to this, it is possible to bake and densify the silicon nitride film SN2 and to generate tensile stress in the film of the silicon nitride film SN2. The description of the ultraviolet ray irradiation process is the same as that given in the first embodiment described above.

Figure 27:
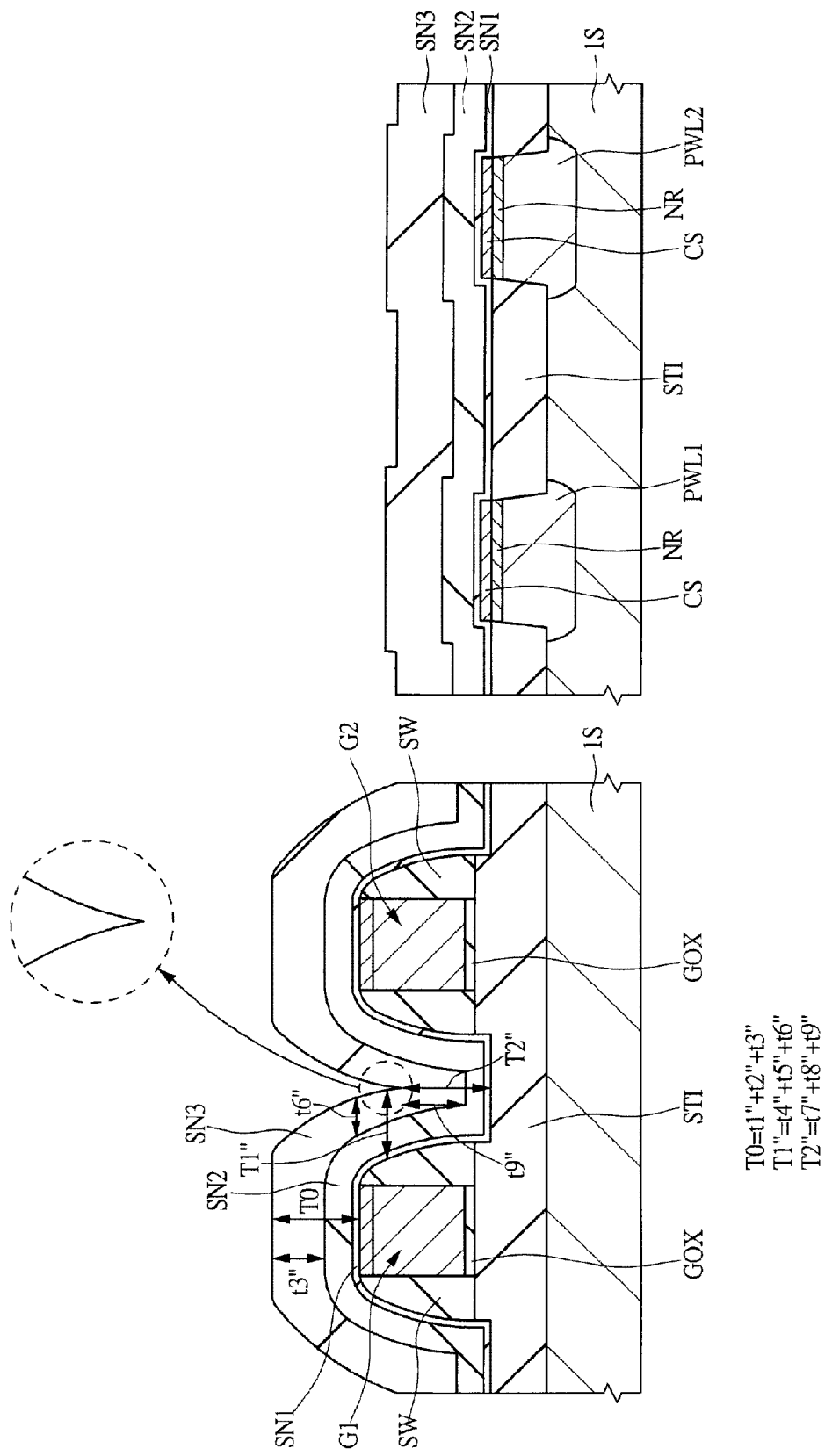
FIG. 27 is a section view showing the manufacturing process of a semiconductor device, following FIG. 26.

Next, as shown in FIG. 27, the silicon nitride film SN3 is formed over the silicon nitride film SN2. It is possible to form the silicon nitride film SN3 using, for example, the plasma CVD method. At this time, specifically, the silicon nitride film SN3 is formed at a film formation temperature of between 300° C. and 500° C. inclusive. Most preferably, the film formation temperature is between 400° C. and 500° C. inclusive. Then, the film formation temperature of the silicon nitride film SN3 is set lower than that of the silicon nitride film SN2 and that of the silicon nitride film SN1.

The film thickness t3" of the silicon nitride film SN3 is greater than the film thickness t1 (=t3) of the silicon nitride film SN3 described in the comparative example (t3">t1). In other words, in the second embodiment, the film thickness t3" of the silicon nitride film SN3 is greater than the film thickness t2" of the silicon nitride film SN2 and the film thickness t1" of the silicon nitride film SN1. Then, also in the second embodiment, the total film thickness of the film thickness t1" of the silicon nitride film SN1, the film thickness t2" of the silicon nitride film SN2, and the film thickness t3" of the silicon nitride film SN3 is T0, the same as that in the comparative example. That is, both in the first embodiment and in the comparative example, the total film thickness of the silicon nitride films SN1 to SN3 is T0 and also in the first embodiment, it is possible to generate tensile stress as in the comparative example. Specifically, also in the first embodiment, by forming the silicon nitride films SN1 to SN3, it is possible to apply tensile stress of 1.3 GPa to 1.7 GPa to the n-channel MISFET. At this time, the total film thickness of the silicon nitride films SN1 to SN3 to be formed on the side wall of the sidewall SW is T1" in both of the cases and the total film thickness of the silicon nitride films SN1 to SN3 to be formed over the element isolation region STI is also T2" in both of the cases.

In the second embodiment, it is assumed that the film thickness of the silicon nitride film SN3 over the gate electrode G1 is t3", the film thickness of the silicon nitride film SN3 to be formed on the side wall of the sidewall SW is t6", and the film thickness of the silicon nitride film SN2 to be formed over the element isolation region STI is t9". In this case, relationships t3">t6" and t3">t9" hold.

However, in the second embodiment, the coverage characteristic of the silicon nitride film SN2, which is a backing film, has been considerably improved compared to the comparative example, and therefore, the coverage characteristic of the silicon nitride film SN3 to be formed over the silicon nitride film SN2 having the improved coverage characteristic is also improved. That is, in the second embodiment, it is possible to improve the surface shape of the silicon nitride film SN3 to be embedded in the region between the gate electrodes G1, G2 into a smoother, forwardly-tapered shape than the surface shape of the silicon nitride film SN3 in the comparative example. In other words, while the surface shape of the silicon nitride film SN3 is a vertical shape in the comparative example, in the first embodiment, the coverage characteristic of the backing film (the silicon nitride film SN2) has been improved more compared to the comparative example, and therefore, it is possible to improve the surface shape of the silicon nitride film SN3 in the second embodiment more than the surface shape of the silicon nitride film SN3 in the comparative example.

In the second embodiment, the coverage characteristic of the silicon nitride film SN2, which is a backing film, has been considerably improved compared even to the first embodiment described above. Because of this, in the second embodiment, after the silicon nitride film SN2 is formed, the aspect ratio in the region between the gate electrodes G1, G2 is not reduced so much as in the first embodiment, however, the coverage characteristic of the silicon nitride film SN2 has been considerably improved accordingly, and therefore, it is possible to improve also the coverage characteristic of the silicon nitride film SN3 to be formed over the silicon nitride film SN2 as in the first embodiment described above.

Because of this, while the first embodiment described above has the technical idea that has taken into consideration both the improvement of the coverage characteristic of the silicon nitride film SN2, which is a backing film, and the reduction of the aspect ratio after the silicon nitride film SN2 is formed, the second embodiment can be thought to have the technical idea that specializes in the considerable improvement of the coverage characteristic of the silicon nitride film SN2, which is a backing film.

Subsequently, after the silicon nitride film SN3 is formed over the silicon nitride film SN2, the silicon nitride film SN3 is irradiated with ultraviolet rays. Due to this, it is possible to bake and densify the silicon nitride film SN3 and to generate tensile stress in the film of the silicon nitride film SN3. The description of the ultraviolet ray irradiation process is the same as that given in the first embodiment described above.

As described above, the characteristics of the second embodiment lie in the configuration of the silicon nitride films SN1 to SN3 formed by lamination, in which the film thickness becomes less in order from the silicon nitride film SN3 in the upper layer to the silicon nitride film SN1 in the lower layer while the total film thickness is kept constant, instead of that the respective film thicknesses of the silicon nitride films SN1 to SN3 are constant values, and in the setting of the film formation temperature of the silicon nitride film SN1 and the silicon nitride film SN2 to a temperature as high as possible but not exceeding 500° C. Due to this, it is possible to improve the embedding characteristic of the silicon nitride film SN3 in the uppermost layer in particular, while ensuring the tensile stress of the silicon nitride films SN1 to SN3, which makes effective the strained silicon technique.

When it is possible to considerably improve the coverage characteristic of the silicon nitride film SN2 to be formed over the silicon nitride film SN1 only by setting the film formation temperature of the silicon nitride film SN1 to a temperature as high as possible but not exceeding 500° C., it may also be possible to set the film formation temperature of the silicon nitride film SN2 lower than that of the silicon nitride film SN1. In this case, it is possible to suppress the variations in the electrical characteristics of a MISFET because it is possible to suppress the thermal budget to a low level for the MISFET formed in the semiconductor substrate 1S.

According to the second embodiment, even when the region (distance) between the gate electrode G1 and the gate electrode G2 is narrowed and the aspect ratio becomes 1.4 or higher, and the total film thickness of the silicon nitride films SN1 to SN3 is ½ or more of the region (distance) between the gate electrode G1 and the gate electrode G2, the noticeable effect is exhibited that the embedding characteristic of the silicon nitride film SN3 in the uppermost layer can be improved.

Figure 28:
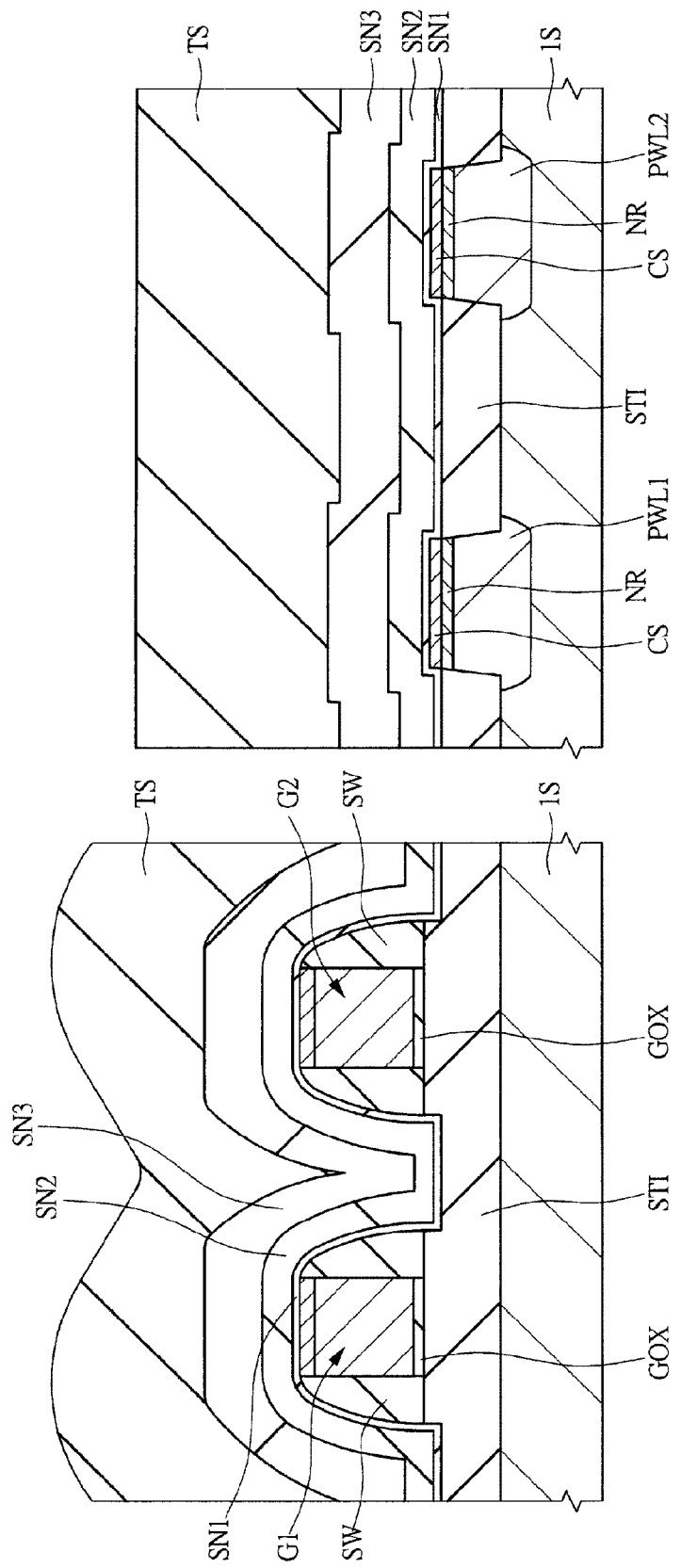
FIG. 28 is a section view showing the manufacturing process of a semiconductor device, following FIG. 27.

Next, as shown in FIG. 28, the silicon oxide film TS is formed over the silicon nitride film SN3. It is possible to form the silicon oxide film TS using, for example, the plasma CVD method that uses ozone ($O_3$) and TEOS (tetra ethyl ortho silicate) as its raw materials. At this time, in the second embodiment, the embedding characteristic of the silicon nitride film SN3 formed between the gate electrodes G1, G2 has been improved, and therefore, it is possible to embed the silicon oxide film TS sufficiently between the gate electrodes G1, G2. Because of this, in the second embodiment, it is possible to prevent a hollow part (void) from being formed in the silicon oxide film TS between the gate electrodes G1, G2. That is, the surface shape of the silicon nitride film SN3 between the gate electrodes G1, G2 is a comparatively smooth, forwardly-tapered shape, instead of a vertical shape, and therefore, the reaction gas spreads sufficiently between the gate electrodes G1, G2 when forming the silicon oxide film TS and it is possible to prevent a void from occurring in the silicon oxide film TS.

Figure 29:
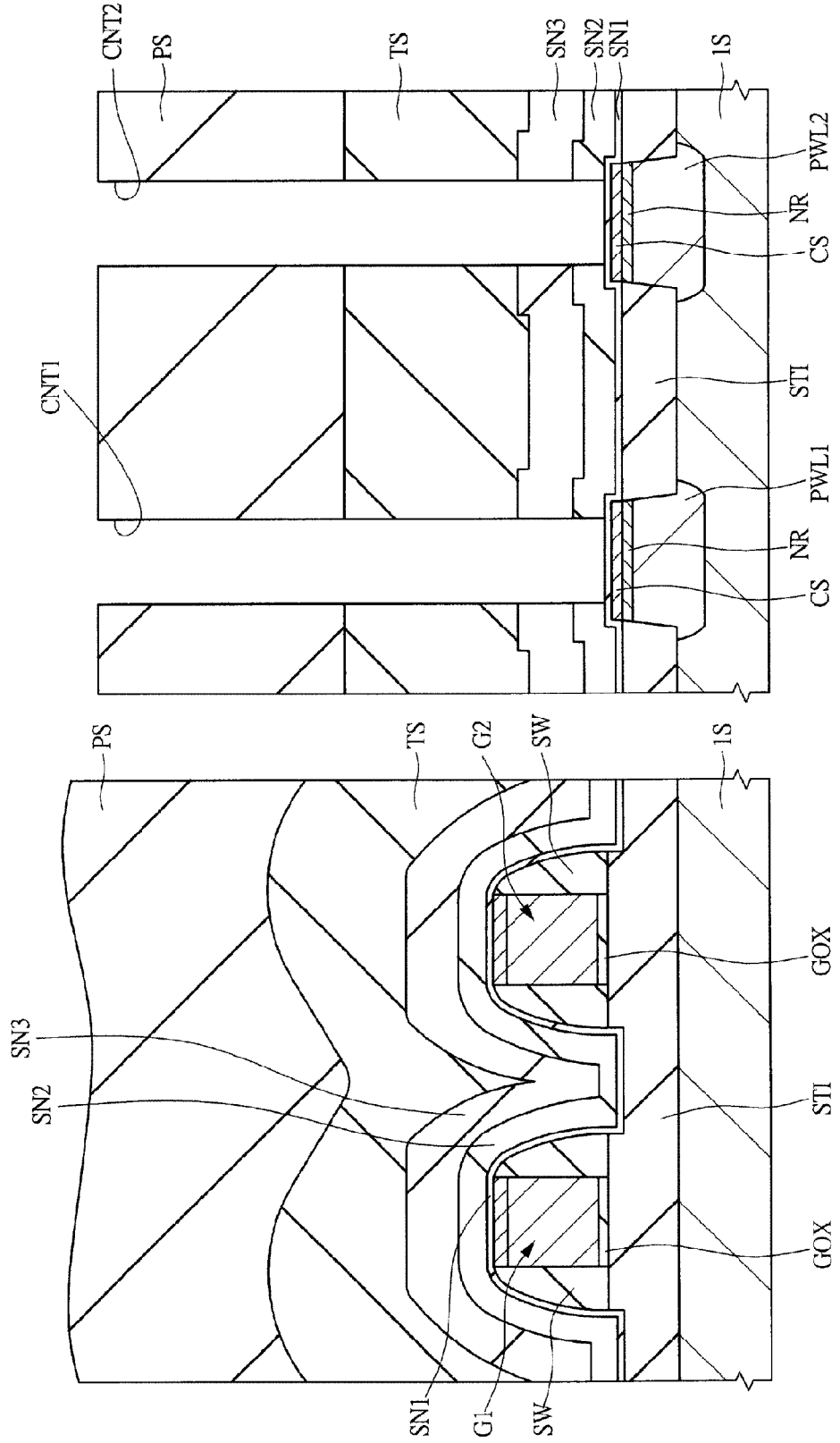
FIG. 29 is a section view showing the manufacturing process of a semiconductor device, following FIG. 28.

Thereafter, as shown in FIG. 29, the silicon oxide film PS is formed over the silicon oxide film TS. It is possible to form the silicon oxide film PS using, for example, the plasma CVD method that uses TEOS as its raw material. Then, using the photolithography technique and the etching technique, the contact hole CNT1 and the contact hole CNT2 that penetrate through the silicon oxide film PS, the silicon oxide film TS, and the silicon nitride films SN1 to SN3 and reach the nickel silicide film CS are formed.

Figure 30:
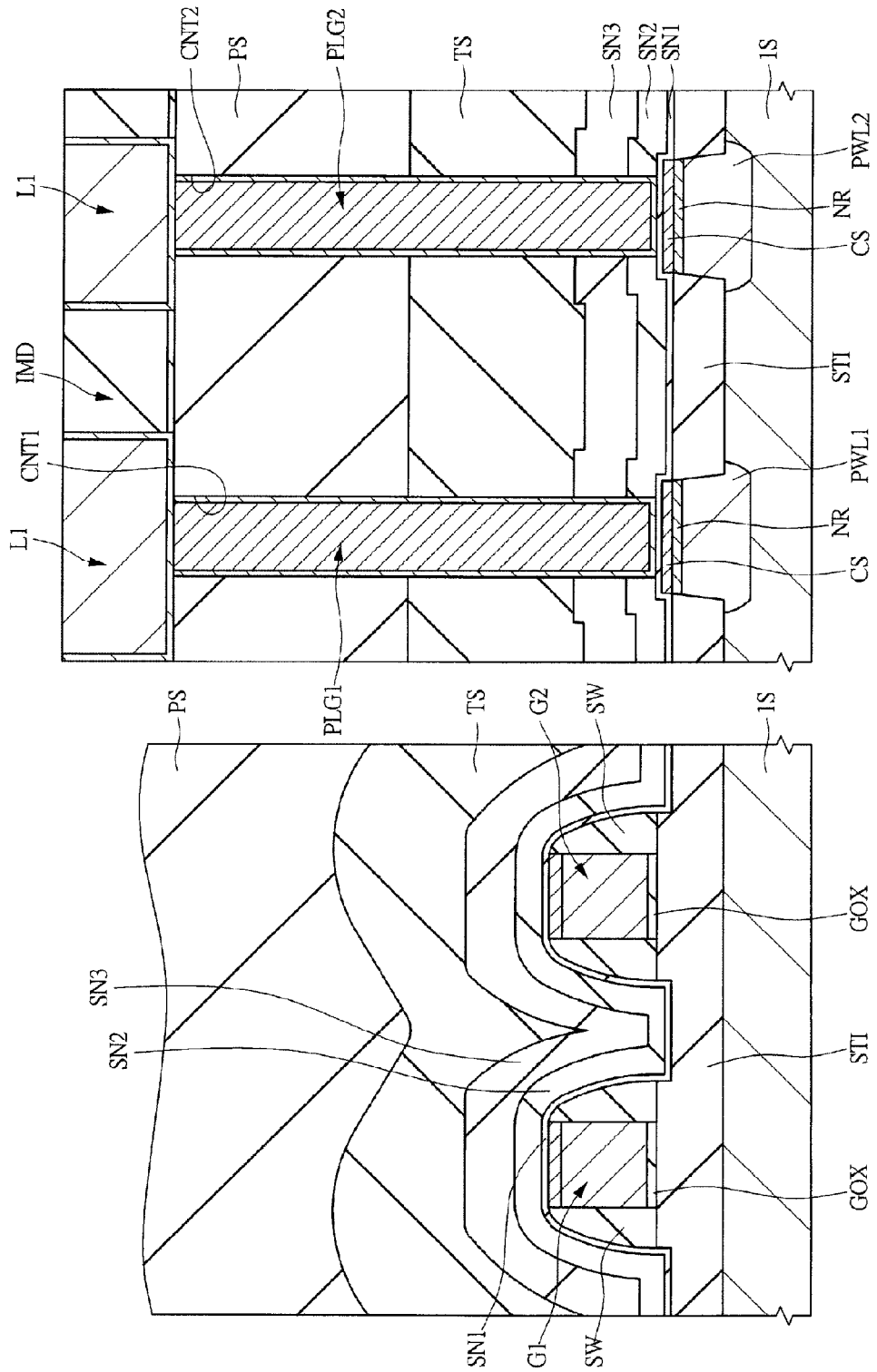
FIG. 30 is a section view showing the manufacturing process of a semiconductor device, following FIG. 29.

Next, as shown in FIG. 30, a titanium/titanium nitride film is formed over the silicon oxide film PS including the bottom and inner wall of the contact holes CNT1, CNT2. The titanium/titanium nitride film includes a laminated film of a titanium film and a titanium nitride film and can be formed using, for example, the sputtering method. The titanium/titanium nitride film has the so-called barrier properties that prevent tungsten, which is a material of a film to be embedded in a process afterward, from diffusing into silicon.

Subsequently, a tungsten film is formed on the entire main surface of the semiconductor substrate 1S so as to be embedded in the contact holes CNT1, CNT2. It is possible to form the tungsten film using, for example, the CVD method. Then, it is possible to form the plugs PLG1, PLG2 by removing the unwanted titanium/titanium nitride film and tungsten film formed over the silicon oxide film PS using, for example, the CMP method.

Thereafter, the wire L1 embedded in the interlayer insulating film is formed in the same manner as that in the first embodiment described above. After that, a multilayer wire is formed in the upper layer of the wire L1, however, its description is omitted here. In the manner described above, it is possible to form the semiconductor device in the second embodiment finally.

As described above, in the second embodiment, it is possible to improve the embedding characteristic of the silicon nitride film SN3 to be embedded between the gate electrodes G1, G2. As a result, the noticeable effects are obtained that it is possible to prevent avoid from occurring in the silicon oxide film TS to be formed over the silicon nitride film SN3 and that it is possible to prevent a short circuit defect from occurring in the plugs PLG1, PLG2 neighboring each other via the void. Consequently, it is possible to improve the reliability of a semiconductor device even if the downsizing of the semiconductor device is advanced.

Here, the second embodiment has the technical idea developed from the standpoint that the silicon nitride film SN1 and the silicon nitride film SN2 are formed from a film as conformal as possible. In the second embodiment, as the formation method of the silicon nitride films SN1 to SN3, the plasma CVD method is used, however, from the standpoint that a conformal film is formed, it can be thought that the ALD (Atomic Layer Deposition) method and the low-pressure CVD method are superior to the former method. However, in order to form a conformal film using the ALD method and the low-pressure CVD method, a film formation temperature of 550° C. to 600° C. is necessary.

Consequently, if the ALD method or the low-pressure CVD method is used as a film formation method of the silicon nitride films SN1 to SN3, there is a high possibility that the already formed nickel silicide film CS may recondense, leading to trouble, such as breakage. That is, if the silicon nitride films SN1 to SN3 are formed using the ALD method or the low-pressure CVD method, there is a possibility that the reliability of a semiconductor device may be degraded.

Therefore, in the second embodiment, the silicon nitride films SN1 to SN3 are formed using the plasma CVD method that is capable of realizing film formation processing at comparatively low temperatures compared to those of the ALD method and the low-pressure CVD method. In this case also, if the film formation temperature is set high, the coverage characteristic of the silicon nitride films SN1, SN2 can be improved, and therefore, the silicon nitride films SN1, SN2 are formed at a temperature as high as possible but not exceeding 500° C., at which temperature, the recondensation of the nickel silicide film CS is not caused.

However, it may also be possible to form a silicide film that does not condense at a temperature higher than 500° C. using the above-described ALD method or low-pressure CVD method. In this case also, it is possible to improve the coverage characteristic by forming the silicon nitride film SN1 so as to be thin, forming the silicon nitride film SN2 so as to be thicker than the silicon nitride film SN1, and forming the silicon nitride film SN3 so as to be thicker than the silicon nitride film SN2 and the silicon nitride film SN1.

The invention developed by the inventors is described specifically based on the embodiments as above, however, the invention is not limited to the embodiments described above, and it is needless to say that there can be various modifications within the scope not departing from its gist.

For example, it is also possible to apply the present invention by combining the first embodiment and the second embodiment described above. In this case, the effects of the respective embodiments can be obtained.

In the above-described embodiments, an example is described, in which the silicon nitride film is formed over the semiconductor substrate including the region between the gate electrodes, however, it is also possible to apply the present invention to the case where the silicon nitride film is formed over the semiconductor substrate including the region between the gate electrodes in the neighboring p-channel MISFETs.

For example, in an SRAM, an n-channel MISFET and a p-channel MISFET are formed over a semiconductor substrate, and therefore, it is possible to apply the technical idea of the present invention to the case where a silicon nitride film is formed so as to cover both of the MISFETs. In particular, even when compression stress is generated in a silicon nitride film to be formed so as to cover a p-channel MISFET and tensile stress is generated in a silicon nitride film to be formed so as to cover an n-channel MISFET by applying the strained silicon technique, the silicon nitride film is similarly embedded in the region between gate electrodes, and therefore, it is possible to apply the technical idea of the present invention.

In such a case, the silicon nitride films SN1 to SN3 that generate tensile stress as in the above-described first or second embodiment are formed once over the n-channel MISFET and the p-channel MISFET. After that, the silicon nitride films SN1 to SN3 over the p-channel MISFET are removed. Subsequently, a silicon nitride film that generates compression stress is formed over the n-channel MISFET and the p-channel MISFET. The silicon nitride film that generates compression stress is formed by lamination based on the same idea as that of the silicon nitride films SN1 to SN3 that generate tensile stress. After that, the laminated silicon nitride film that generates compression stress over the n-channel MISFET is removed. Due to this, it is possible to form the laminated silicon nitride films SN1 to SN3 that generate tensile stress over the n-channel MISFET and to form the laminated silicon nitride film that generates compression stress over the p-channel MISFET.

It is possible to apply stresses (tensile stress and compression stress) in different directions to the silicon nitride films that cover the n-channel MISFET and the p-channel MISFET, respectively, formed over the same semiconductor substrate by changing the formation conditions (reaction gas, flow rate of reaction gas, pressure, formation temperature, high-frequency power, etc.). That is, the silicon nitride film that covers the n-channel MISFET and the silicon nitride film that covers the p-channel MISFET are formed under different formation conditions.

It is also possible to form silicon nitride films so as to cover the n-channel MISFET and the p-channel MISFET and generate tensile stress in the silicon nitride film that covers the n-channel MISFET and generate compression stress in the silicon nitride film that covers the p-channel MISFET by changing the conditions when irradiating the silicon nitride films with ultraviolet rays. That is, the condition of ultraviolet ray irradiation for the silicon nitride film that covers the n-channel MISFET and the condition of ultraviolet ray irradiation for the silicon nitride film that covers the p-channel MISFET are different formation conditions.

In the above-described embodiments, an example is described, in which the silicon nitride film is formed so as to include three layers, however, this is not limited, and for example, it may also be possible to form the silicon nitride film so as to include two layers or form the silicon nitride film so as to include four or more layers. For example, when forming the silicon nitride film so as to include two layers, the process is simplified compared to the case when forming the silicon nitride film so as to include three layers, and therefore, the throughput can be improved. Because of this, there is an advantage that the process to form the silicon nitride film so as to include two layers can be applied to mass-production more easily. On the other hand, when forming the silicon nitride film so as to include four or more layers, it is possible to reduce the film thickness of each film compared to the case when forming the silicon nitride film so as to include three layers, and therefore, there is an advantage that the coverage characteristic of the respective films can be further improved and the embedding characteristic of the silicon nitride film can be further improved. In this case, it is possible to obtain the same effects as those in the above-described first and second embodiments by forming the silicon nitride film in the lower layer so as to be thin and forming the silicon nitride film in the upper layer so as to be thick.

In the above-described first and second embodiments, a silicon nitride film is illustrated as an example, however, a SiON (silicon oxynitride) film, a SiCN (carbon doped silicon nitride) film, a SiOC (carbon doped silicon oxide) film, a SiONC (carbon doped silicon oxynitride) film, or a SiOF (fluorine doped silicon oxide) film may be used in the configuration as long as it is a film that can generate the above-described stress or can function as an etching stopper. In this case, for example, it is possible to reduce the dielectric constant of the silicon nitride film, and therefore, it is possible to reduce the parasitic capacitance and improve the properties of a semiconductor device. Further, these films do not need to be the same film, and it is possible to form these films from different materials, respectively, as long as they have the same effects as those in the above-described first and second embodiments. For example, it is also possible to form a film corresponding to the silicon nitride film SN1 by a SiN film, form a film corresponding to the silicon nitride film SN2 by a SiON film, and form a film corresponding to the silicon nitride film SN3 by a SiCN film.

It may also be possible to configure the silicon oxide film PS by a SiOC film or a SiOF film. In this case, for example, it is possible to reduce the dielectric constant of the interlayer insulating film, and therefore, it is possible to reduce the parasitic capacitance and improve the properties of a semiconductor device. In addition, it may also be possible to provide, for example, a SiOC film or a SiOF film between the silicon oxide film TS and the silicon oxide film PS. It is needless to say that it may also be possible to provide, for example, a SiOC film or a SiOF film over the silicon oxide film PS.

In the above-described first embodiment, as shown in FIG. 3 etc., the region between gate electrodes of the two MISFETs (Qt2) constituting an SRAM is described, and the case where the gate lengths of the MISFETs are the same is illustrated as an example, however, this is not limited and the same effects can be obtained also in the case where the gate lengths are different between the gates.

Each film thickness of the silicon nitride films SN1 to SN3 shown in the first and the second embodiments is described below. A case is illustrated where the film thickness t1 of the silicon nitride films SN1 to SN3 in the comparative example to be discussed shown in FIG. 11 is 15 nm. The film thickness t1' of the silicon nitride film SN1 shown in FIG. 19 is, for example, 12 nm. The film thickness t2' of the silicon nitride film SN2 shown in FIG. 20 is, for example, 15 nm. The film thickness t3' of the silicon nitride film SN3 shown in FIG. 21 is, for example, 18 nm. Further, these film thicknesses are the same both in the first embodiment and in the second embodiment.

There is a case where the film thickness of the silicon nitride film SN2 may be formed so as to be thicker than that of the silicon nitride film SN1 unintentionally due to the process variations in manufacturing devices even when an attempt is made to form the silicon nitride films SN1 to SN3 so that they have the same film thickness t1. The silicon nitride films SN1 to SN3 in the first embodiment and the second embodiment are formed so that the film thicknesses (t1', t2', t3') are greater than the thickness due to such process variations etc. Specifically, the film thickness t2' is formed so as to be 3 nm or greater than the film thickness t1' and the film thickness t3' is formed so as to be 3 nm or greater than the film thickness t2'.

FIG. 22 and FIG. 23 show the case where the film thickness of the silicon oxide film TS is about 300 nm and the film thickness of the silicon oxide film PS is about 400 nm. The film thicknesses of the silicon oxide film TS and the silicon oxide film PS are sufficiently greater than the total film thickness T0 (=t1'+t2'+t3') of the silicon nitride films SN1 to SN3.

The number of the contact holes (CNT1, CNT2) and the plugs (PLG1, PLG2) shown in the first embodiment and the second embodiment may be two or more, or one.

The present invention can be utilized widely in the manufacturing industry that manufactures semiconductor devices.

What is claimed is:
1. A method of manufacturing a semiconductor device, comprising the steps of:
(a) forming a plurality of MISFETs including a first MISFET and a second MISFET neighboring each other over a semiconductor substrate;
(b) after the step (a), forming a multilayer insulating film over the semiconductor substrate including a first region between a first gate electrode of the first MISFET and a second gate electrode of the second MISFET;
(c) after the step (b), forming an interlayer insulating film over the multilayer insulating film;
(d) after the step (c), forming a plurality of contact holes that penetrate through the interlayer insulating film and the multilayer insulating film and reach the semiconductor substrate in the first region along a first direction in which the first and second gate electrodes extend in parallel; and
(e) after the step (d), forming a plug by embedding a conductive material in the contact holes,
wherein the step (b) includes the steps of:

(b1) forming a first insulating film having a first film thickness to be formed over the respective gate electrodes of the MISFETs over the semiconductor substrate; and (b2) after the step (b1), forming a second insulating film having a second film thickness greater than the first film thickness to be formed over the respective gate electrodes of the MISFETs over the first insulating film, wherein the multilayer insulating film includes the first insulating film and the second insulating film, wherein the first and second insulating films are formed of the same material, and wherein the interlayer insulating film and the first and second insulating films are formed of a different material.

2. The method of manufacturing a semiconductor device according to claim 1,
wherein the step (a) includes the steps of:
(a1) forming the first gate electrode of the first MISFET and the second gate electrode of the second MISFET; and
(a2) after the step (a1), forming sidewalls on the side wall of the first gate electrode and on the side wall of the second gate electrode, and
wherein the total film thickness of the first film thickness of the first insulating film and the second film thickness of the second insulating film is ½ or more of the distance between the sidewall of the first MISFET and the sidewall of the second MISFET in opposition to each other.

3. The method of manufacturing a semiconductor device according to claim 1,
wherein the step (b) further includes the step of
(b3) after the step (b2), forming a third insulating film having a third film thickness greater than the second film thickness to be formed over the respective gate electrodes of the MISFETs over the second insulating film, and
wherein the multilayer insulating film includes the first insulating film, the second insulating film, and the third insulating film.

4. The method of manufacturing a semiconductor device according to claim 3,
wherein the step (a) includes the steps of:
(a1) forming the first gate electrode of the first MISFET and the second gate electrode of the second MISFET; and
(a2) after the step (a1), forming sidewalls on the side wall of the first gate electrode and on the side wall of the second gate electrode, and
wherein the total film thickness of the first film thickness of the first insulating film, the second film thickness of the second insulating film, and the third film thickness of the third insulating film is ½ or more of the distance between the sidewall of the first MISFET and the sidewall of the second MISFET in opposition to each other.

5. The method of manufacturing a semiconductor device according to claim 1,
wherein the step (b1) forms the first insulating film at a first temperature, and
wherein the step (b2) forms the second insulating film at a second temperature lower than the first temperature.

6. The method of manufacturing a semiconductor device according to claim 5,
wherein the step (b1) forms the first insulating film using the plasma CVD method, and wherein the step (b2) also forms the second insulating film using the plasma CVD method.

7. The method of manufacturing a semiconductor device according to claim 6,
wherein the first temperature and the second temperature are both between 300° C. and 500° C. inclusive.

8. The method of manufacturing a semiconductor device according to claim 1,
wherein the first and second insulating films are silicon nitride.

9. The method of manufacturing a semiconductor device according to claim 8,
wherein the first and second insulating films are formed using the plasma CVD method.

10. The method of manufacturing a semiconductor device according to claim 9,
wherein the interlayer insulating film includes a silicon oxide film.

11. The method of manufacturing a semiconductor device according to claim 10,
wherein the silicon oxide film is formed using the plasma CVD method that uses ozone and TEOS as its raw materials.

12. The method of manufacturing a semiconductor device according to claim 1,
wherein the first MISFET and the second MISFET are an n-channel MISFET.

13. The method of manufacturing a semiconductor device according to claim 12,
wherein the first and second insulating films formed so as to cover the first MISFET and the second MISFET are silicon nitride, and
wherein in the channel region of the first MISFET and in the channel region of the second MISFET, tensile stress is generated by the silicon nitride film in the direction of the gate length of the first MISFET and in the direction of the gate length of the second MISFET.

14. The method of manufacturing a semiconductor device according to claim 13,
wherein the absolute value of the tensile stress generated by the silicon nitride film in the channel region of the first MISFET and in the channel region of the second MISFET is 1.3 to 1.7 GPa.

15. The method of manufacturing a semiconductor device according to claim 13, further comprising the steps of:
after the step (b1) and before the step (b2), irradiating the first insulating film with ultraviolet rays; and
after the step (b2) and before the step (c), irradiating the second insulating film with ultraviolet rays.

16. The method of manufacturing a semiconductor device according to claim 1,
wherein the first MISFET and the second MISFET are a p-channel MISFET.

17. The method of manufacturing a semiconductor device according to claim 16,
wherein the first and second insulating films formed so as to cover the first MISFET and the second MISFET are silicon nitride; and
wherein in the channel region of the first MISFET and in the channel region of the second MISFET, compression stress is generated by the silicon nitride film in the direction of the gate length of the first MISFET and in the direction of the gate length of the second MISFET.

18. The method of manufacturing a semiconductor device according to claim 2,
wherein when it is assumed that the distance between the sidewall of the first MISFET and the sidewall of the second MISFET in opposition to each other is S and the height of the first gate electrode of the first MISFET or the height of the second gate electrode of the second MISFET is h, an aspect ratio defined by h/S is 1.4 or more.

19. The method of manufacturing a semiconductor device according to claim 1,
wherein the first gate electrode of the first MISFET and the second gate electrode of the second MISFET extend also over an element isolation region formed over the semiconductor substrate, and
wherein the first region exists between the first gate electrode and the second gate electrode arranged over the element isolation region.

20. The method of manufacturing a semiconductor device according to claim 19,
wherein the first MISFET and the second MISFET are a MISFET that constitutes an SRAM.

21. The method of manufacturing a semiconductor device according to claim 1,
wherein the step (d) of forming the contact holes includes the steps of:
(d1) etching the interlayer insulating film; and
(d2) after the step (d1), etching the multilayer insulating film, and
wherein in the step (d1), the multilayer insulating film functions as an etching stopper.

* * * * *